(12) United States Patent
Jonishi

(10) Patent No.: US 9,252,144 B2
(45) Date of Patent: Feb. 2, 2016

(54) FIELD EFFECT TRANSISTOR AND A DEVICE ELEMENT FORMED ON THE SAME SUBSTRATE

(71) Applicant: FUJI ELECTRIC CO., LTD., Kawasaki-shi (JP)

(72) Inventor: Akihiro Jonishi, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/615,899

(22) Filed: Feb. 6, 2015

(65) Prior Publication Data

US 2015/0255454 A1    Sep. 10, 2015

(30) Foreign Application Priority Data

Mar. 7, 2014    (JP) .................. 2014-044726

(51) Int. Cl.
*H01L 29/00* (2006.01)
*H01L 27/06* (2006.01)
*H01L 29/735* (2006.01)
*H01L 29/78* (2006.01)
(Continued)

(52) U.S. Cl.
CPC .......... *H01L 27/0635* (2013.01); *H01L 27/092* (2013.01); *H01L 28/20* (2013.01); *H01L 29/063* (2013.01); *H01L 29/0634* (2013.01); *H01L 29/1095* (2013.01); *H01L 29/735* (2013.01); *H01L 29/7823* (2013.01)

(58) Field of Classification Search
CPC .......................... H01L 29/063; H01L 29/0634
See application file for complete search history.

(56) References Cited

U.S. PATENT DOCUMENTS 5,801,418 A    9/1998    Ranjan
6,124,628 A    9/2000    Fujihira et al.
(Continued)

FOREIGN PATENT DOCUMENTS

JP    09055498 A    2/1997
JP    3214818 B2    10/2001
(Continued)

OTHER PUBLICATIONS

Y. Yoshino, et al., "A new 1200V HVIC with a novel high voltage Pch-MOS", Proceedings of the 22nd International Symposium on Power Semiconductor Devices & ICs, Hiroshima, 2010, pp. 93-96.
(Continued)

*Primary Examiner* — Ngan Ngo
(74) *Attorney, Agent, or Firm* — Rossi, Kimms & McDowell LLP

(57) ABSTRACT

An n⁻ type diffusion region surrounds a high side well region and is electrically isolated from a low side region. In the n⁻ diffusion region formed are a first p type diffusion region and the second p type diffusion region separated with each other. The first p type diffusion region composes a double RESURF structure in an nch MOSFET in the level shift-up circuit, and in a high voltage junction terminating structure. The second p type diffusion region composes a double RESURF structure of a pch MOSFET of a level shift-down circuit. The impurity concentration of the n⁻ type diffusion region is in the range of $1.3 \times 10^{12}/cm^2$ to $2.8 \times 10^{12}/cm^2$. The impurity concentration of the first p type diffusion region and the impurity concentration of the second p type diffusion region are in the range of $1.1 \times 10^{12}/cm^2$ to $1.4 \times 10^{12}/cm^2$.

17 Claims, 19 Drawing Sheets

(51) Int. Cl.
*H01L 29/06* (2006.01)
*H01L 49/02* (2006.01)
*H01L 29/10* (2006.01)
*H01L 27/092* (2006.01)

(56) References Cited

U.S. PATENT DOCUMENTS

2006/0124997 A1* 6/2006 Yamauchi et al. ............ 257/330
2006/0220168 A1 10/2006 Hsing
2010/0001315 A1* 1/2010 Okita et al. .................... 257/139
2010/0078724 A1* 4/2010 Imoto et al. .................... 257/355
2014/0062571 A1 3/2014 Nakashima et al.
2014/0070287 A1* 3/2014 Zhang et al. .................. 257/288

FOREIGN PATENT DOCUMENTS

JP 2003078134 A 3/2003
JP 3952967 B2 8/2007

OTHER PUBLICATIONS

Y. Yoshino et al., "A novel high voltage new Pch-MOS with a new drain drift structure for 1200V HVICs", Proceedings of the 25th International Symposium on Power Semiconductor Devices & ICs, Kanazawa, 2013, pp. 77-80.
M. Imam et al., "Design and Optimization of Double-RESURF High-Voltage Lateral Devices for a Manufacturable Process", IEEE Transactions on Electron Devices, vol. 50, No. 7, Jul. 2003, pp. 1697-1701.
Extended European Search Report issued in EP15154323.8, mailed Nov. 20, 2015.
Yamazaki et al., "High-Voltage p-Channel Level Shifter Using Charge-Controlled Self-Isolation Structure", Japanese Journal of Applied Physics, Japan Society of Applied Physics, vol. 45, No. 9A, Sep. 2006, pp. 6914-6916. XP-001502370. Cited in NPL 1.

* cited by examiner

FIELD EFFECT TRANSISTOR AND A DEVICE ELEMENT FORMED ON THE SAME SUBSTRATE

CROSS-REFERENCE TO RELATED APPLICATION

This application is based on, and claims priority to, Japanese Patent Application No. 2014-044726, filed on Mar. 7, 2014, contents of which are incorporated herein by reference.

BACKGROUND OF THE INVENTION

1. Field of the Invention

Embodiments of the present invention relate to a semiconductor device.

2. Background

Traditionally, inverters for industrial application have been using transformers and photo-couplers to perform electrically isolated signal transmission in the gate driving of switching elements such as insulated gate bipolar transistors (IGBTs) that compose a power conversion bridge circuit. Recently, however, the transformers and photo-couplers are replaced for cost reduction in low capacity applications, in particular, by high voltage integrate circuits (HVICs) that do not perform electrical insulation. U.S. Patent Application Publication No. 2006/0220168, M. Yoshino et al., "A new 1200 V HVIC with a novel high voltage Pch-MOS", Proceedings of the 22nd International Symposium on Power Semiconductor Devices & ICs, Hiroshima, 2010, pp. 93-96, ("Yoshino et al. '2010") and M. Yoshino et al., "A novel high voltage new Pch-MOS with a new drain drift structure for 1200 V HVICs", Proceedings of the 25th International Symposium on Power Semiconductor Devices & ICs, Kanazawa, 2013, pp. 77-80, ("Yoshino et al. '2013"), for example, disclose such HVICs. The following describes the construction of a conventional HVIC.

FIG. 15 is a plan view showing the overall construction of a conventional HVIC. FIG. 16 is a circuit diagram showing the circuit construction of the HVIC depicted in FIG. 15. The following describes an example of HVIC 100 connected to a bridge circuit 120 of a power converter and driving the first IGBT 121 at the high side of the first and second IGBTs 121 and 122 composing one phase of the bridge circuit 120 of a power converter. The conventional HVIC 100 shown in FIG. 15 and FIG. 16 includes, on a single semiconductor chip, a high side gate driving circuit 101, and abnormality detecting circuit 102, an input/control circuit 103, a level shift-up circuit 104, a level shift-down circuit 107, and a high voltage junction terminating (HVJT) structure 111.

The high side gate driving circuit 101 and the abnormality detecting circuit 102 are disposed in the high side well region 112 and is operated with a reference potential of the emitter potential VS of the first IGBT 121 at the high side of the bridge circuit 120 of a power converter, a power supply potential of VB, and a power supply voltage of VCC'. The high side well region 112 is a high voltage region having a floating potential electrically isolated from the low side region 113 by the high voltage junction terminating structure 111. The abnormality detecting circuit 102 transmits an abnormality signal to the input/control circuit 103. The VB potential is a sum of a power supply voltage VCC' and the emitter potential VS of the first IGBT 121 at the high side of the bridge circuit 120 of the power converter: VB=VS+VCC'.

The input/control circuit 103 is located in the low side region 113 and operates with a reference potential of GND potential. The input/control circuit 103 is operated with a power supply potential VCC supplied from the VCC terminal and controls the output HO of the high side gate driving circuit 101 according to a control signal HIN from an external microcontroller, for example, and an abnormality detection signal from the abnormality detecting circuit 102. The level shift-up circuit 104 is composed of two level shift circuits for a setting signal and for a resetting signal. Each of the two level shift circuits is composed of an n channel metal oxide semiconductor field effect transistor (nch MOSFET) 105 with a high breakdown voltage and a level shift resistor 106.

The nch MOSFET 105 of the level shift-up circuit 104 is disposed in the high voltage junction terminating structure 111, and the level shift resistor 106 is disposed in the high side well region 112. The level shift-up circuit 104 converts the setting signal and resetting signal with the reference potential of the ground potential fed from the input/control circuit 103 into signals with a reference potential of the VB potential, and delivers the converted signals to a latching circuit 110 at the next stage. The set signal is given to turn ON the high side gate driving circuit 101 for delivering a gate signal HO to the first IGBT 121 at the high side of the bridge circuit 120 of the power converter. The reset signal is given to turn OFF the high side gate driving circuit 101.

The output terminal Q of the latching circuit 110 is connected to the gate terminal of a p channel MOSFET (pch MOSFET) for charging the gate of the first IGBT 121 at the high side of the bridge circuit 120 of the power converter and to the gate terminal of an nch MOSFET for discharging the gate of the first IGBT 121. The level shift-down circuit 107 is composed of a high voltage pch MOSFET 108 and a level shift resistor 109. The pch MOSFET 108 of the level shift-down circuit 107 is disposed in the high voltage junction terminating structure 111 and the level shift resistor 109 is disposed in the low side region 113. The level shift-down circuit 107 transforms an abnormality detection signal with a reference potential of VB potential delivered from the abnormality detecting circuit 102 into a signal with a reference potential of the ground potential, and transmits the signal into the input/control circuit 103. FIG. 16 also indicates a bootstrap diode 124 and a bootstrap capacitor 125.

A planar construction of the high side well region 112 and the surroundings thereof of the conventional HVIC 100 is described below. FIG. 17 is a plan view showing in detail the planar construction around the high side well region of the HVIC of FIG. 15. FIG. 17 shows only one nch MOSFET 105 of the level shift-up circuit 104 to clearly show the planar construction of the conventional HVIC 100. As shown in FIG. 17, the high side well region 112 is composed of an n type diffusion region 14 and a low concentration n⁻ type diffusion region 13 surrounding the n type diffusion region 14. The n⁻ type diffusion region 13 and the n type diffusion region 14 are connected to the VB potential. The n⁻ type diffusion region 13 is surrounded by the n⁻ type diffusion region 1.

Between the n⁻ type diffusion region 13 and the n⁻ type diffusion region 1, a p⁻ diffusion region 12, which is an isolating region, is provided. The n⁻ type diffusion region 1 is surrounded by a p⁺ type diffusion region 11 at a GND potential, which is a p⁺ type GND region. In the n type diffusion region 14 arranged are a high side gate driving circuit 101, the abnormality detecting circuit 102, and the components of the level shift-up circuit 104 including the level shift resistor 106 but excluding the nch MOSFET 105. In the n⁻ type diffusion region 1 arranged are the high voltage junction terminating structure 111, the nch MOSFET 105 of the level shift-up circuit 104, and the pch MOSFET 108 of the level shift-down circuit 107.

The following describes the sectional construction of the nch MOSFET 105, the pch MOSFET 108, and the high voltage junction terminating structure 111 of the conventional HVIC 100. FIG. 18 is a sectional view showing the sectional construction along the line AA-AA' indicated in FIG. 17; FIG. 19 is a sectional view showing the sectional construction along the line BB-BB' indicated in FIG. 17; and FIG. 20 is a sectional view showing the sectional construction along the line CC-CC' indicated in FIG. 17. FIG. 18 depicts the sectional construction of the nch MOSFET 105; FIG. 19 depicts the sectional construction of the pch MOSFET 108; and FIG. 20 depicts the sectional construction of the high voltage junction terminating structure 111.

Commonly in the sectional constructions of FIGS. 18, 19 and 20 shown are the n⁻ type diffusion region 1, and n⁻ type diffusion region 13 and the n type diffusion region 14 composing the high side well region 112 selectively formed in the front surface region of the p type semiconductor substrate 10. The n⁻ type diffusion region 13 is disposed in the outer peripheral side than the n type diffusion region 14, and the n⁻ type diffusion region 1 is disposed in the outer peripheral side than the high side well region 112. A p⁻ type diffusion region 15 is provided in the outer peripheral side of the substrate on the front surface layer of the substrate. The p⁻ type diffusion region 15 penetrates in the depth direction through the n⁻ type diffusion region 1 reaching a p type region in the back surface side of the substrate. In the p⁻ type diffusion region 15, a p⁺ type GND region 11 is selectively provided.

As shown in FIG. 18, the nch MOSFET 105 of the level shift-up circuit 104 is provided with a RESURF structure with the n⁻ type diffusion region 1 and the p type semiconductor substrate 10, the RESURF structure being a single RESURF structure. The n⁻ type diffusion region 1 also functions as a drift region. The impurity concentration of the n⁻ type diffusion region 1 is about $1.0 \times 10^{12}/cm^2$. In the n⁻ type diffusion region 1 around the nch MOSFET 105, an isolation region 12 is provide between the n⁻ type diffusion region 1 and the n⁻ type diffusion region 13 in the deeper depth than the n⁻ type diffusion region 1 from the front surface of the substrate. The isolation region 12 isolates the n⁻ type diffusion region 1 from the n⁻ type diffusion region 13.

M. Imam et al., "Design and Optimization of Double-RESURF High-Voltage Lateral Devices for a Manufacturable Process", IEEE Transactions on Electron Devices, vol. 50, no. 7, July 2003, pp, 1697-1701, ("Imam et al.") for example, discloses that the optimum impurity concentration of an n⁻ type diffusion region 1 is at most $1.4 \times 10^{12}/cm^2$ to obtain a desired breakdown voltage for a single RESURF structure.

As shown in FIG. 19, the pch MOSFET 108 of the level shift-down circuit 107 has a double RESURF structure with a p type diffusion region 2, the n⁻ type diffusion region 1, and the p type semiconductor substrate 10. In the n⁻ type diffusion region 1 around the pch MOSFET 108, the isolation region 12 is not provided between the n⁻ type diffusion region 1 and the n⁻ type diffusion region 13, and the n⁻ type diffusion region 1 is in contact with the n⁻type diffusion region 13. The p type diffusion region 2 is formed in the front surface layer of the substrate with a depth shallower than the n⁻ type diffusion region 1. The p type diffusion region 2 not only composes a double-RESURF structure, but also functions as a p type drift region. The impurity concentration of the p type diffusion region 2 is in the range of $5.0 \times 10^{11}/cm^2$ to $1.0 \times 10^{12}/cm^2$.

As shown in FIG. 20, the high voltage junction terminating structure 111 has, like the nch MOSFET 105, a single RESURF structure with the n⁻ type diffusion region 1 and the p type semiconductor substrate 10. In the place of the high voltage junction terminating structure 111, the isolation region 12 is provided between the n⁻ type diffusion region 1 and the n⁻ type diffusion region 13, and the n⁻ type diffusion region 1 is isolated from the n⁻ type diffusion region 13 by the isolation region 12.

In FIG. 18, the symbols 3, 4, 5, 7, 8, and 9 represent the components composing a structure of MOS gate structure, which is an insulated gate structure comprising a metal-oxide film-semiconductor gate, of the nch MOSFET 105. The symbol 16 in FIG. 18 indicates a contact, which is an electrical contact region, between a VB electrode 39 and the n type diffusion region 14. The symbols 24, 25, 27, 28, and 29 (in FIG. 19) represent the components composing the MOS gate structure of the pch MOSFET 108. The symbols 31, 32 and 33 (in FIGS. 18, 19, and 20) represent local oxidation of silicon film (LOCOS film), interlayer dielectric film, and a resistive field plate, which is a resistor functioning as a field plate, respectively. The symbols 34 and 35 (in FIG. 18) represent a source electrode and a drain electrode of the nch MOSFET 105, respectively. The symbols 36 and 37 (in FIG. 19) represent a source electrode and a drain electrode of the pch MOSFET 108. The symbols 38 (in FIG. 19) and 40 (in FIG. 18) represent a GND electrode and a field plate, respectively.

Now, operation of the conventional HVIC 100 will be described below. A control signal from a microcontroller, for example, given to the input/control circuit 103 is transmitted to the high side gate driving circuit 101 to drive the first IGBT 121 at the high side, for example, connected to the conventional HVIC 100, of the first IGBT 121 and the second IGBT 122 composing one phase of the bridge circuit 120 of a power converter. When the abnormality detecting circuit 102 detects any abnormality such as over-current or over-heating, the abnormality detecting circuit 102 transmits an abnormality signal to the input/control circuit 103, and the first IGBT 121 at the high side is turned OFF and the abnormality is notified to the microcontroller.

As described earlier, the high side gate driving circuit 101 is operated on a reference potential of the emitter potential VS of the first IGBT 121 at the high side of the bridge-connected circuit, wherein the potential VS is the potential at the node 123 between the first IGBT 121 and the second IGBT 122 at the low side. The reference potential of the high side gate driving circuit 101 rises to several hundred volts at the maximum above the reference potential, which is the ground potential, of the input/control circuit 103. However, the high voltage junction terminating structure 111 holds a breakdown voltage between the high side gate driving circuit 101 and the input/control circuit 103.

Japanese Patent No. 3952967 discloses a HVIC of this type. This HVIC has a three layer structure comprising a first region of a first conductivity type, a second region of a second conductivity type formed selectively in the surface layer of the first principal surface of the first region, and a third region of the first conductivity type formed selectively in the surface layer of the second region. The net doping amount of the second region is in the range of $1 \times 10^{11}/cm^2$ to $4 \times 10^{12}/cm^2$ so that the depletion layer extending to both sides of a first pn junction between the first region and the second region and the depletion layer extending to both sides of a second pn junction between the second region and the third region are united in the second region, when both the first pn junction and the second pn junction are reversely biased. The net doping amount of the third region is in the range of $1 \times 10^{11}/cm^2$ to $2 \times 10^{12}/cm^2$ so that the depletion layer extending to both sides of the second pn junction reaches the surface of the third region. The HVIC further includes, inside an area surrounded by the third region, a second conductivity type region electrically connected to the second region, a first conductivity type region selectively formed in the surface layer of the second conductivity type region, a first conductivity type channel MIS transistor formed in the surface layer of the second conductivity type region, and a second conductivity type channel MIS transistor formed in the surface layer of the first conductivity type region.

Japanese Patent No. 3214818 discloses another HVIC. This HVIC includes: a semiconductor material layer of a first conductivity type disposed on a semiconductor substrate and having an upper surface subjected to doping treatment, a base region of a second conductivity type formed in the surface region of the semiconductor material layer to a predetermined depth and having substantially a semicircular shape, a source region of the first conductivity type formed in the base region and forming a surface channel region between the source region and the semiconductor material layer, a source electrode in contact with the source region and electrically connected to a low voltage reference control circuit, a gate insulating layer disposed so as to be in contact with the source region and a part of the upper surface of the surface channel region, a conductive gate layer disposed in the gate insulating layer, a drain region formed in the upper surface region of the semiconductor material layer at a position laterally apart from the base region, a drain electrode formed on the drain region and in contact with a part of the upper surface of the semiconductor material layer, a contact electrode in contact with another part of the upper surface of the semiconductor material layer and electrically connected to a floating high voltage circuit, in which a part of the semiconductor material layer at the position between the contact electrode and the drain electrode forms a conductive region, and a resistance element disposed between the drain electrode and the contact electrode and arranged electrically in parallel to the conductive region of the semiconductor material layer. The base region with a substantially semicircular shape forms a peripheral ring part of the floating high voltage circuit, and a level shift circuit is provided in the peripheral ring part.

Japanese Unexamined Patent Application Publication No. H09-055498 discloses still another HVIC. The HVIC includes: a first region of a p type semiconductor substrate, an n type second region selectively formed in the surface layer of the first region, a p type third region selectively formed in the surface layer of the second region, an n type fifth region selectively formed in the surface layer of the second region, a p type sixth region selectively formed in the surface layer of the third region, a pch MOSFET formed in the surface layer of the second region, an nch MOSFET formed in the surface layer of the third region, and a high voltage junction terminating structure provided surrounding the first region.

However, the conventional HVIC 100 described above referring to FIG. 15 and FIG. 16 has the following problems. As described earlier, the conventional HVIC 100 employs a single RESURF structure in the nch MOSFET 105 and in the high voltage junction terminating structure 111 composed of the n$^-$ type diffusion layer 1 and the p type semiconductor substrate 10, whereas the pch MOSFET 108 employs a double RESURF structure composed of the p type diffusion region 2, the n$^-$ type diffusion region 1, and the p type semiconductor substrate 10. As a result, the optimum condition for the n$^-$ type diffusion region 1 differs for the pch MOSFET 108, and for the nch MOSFET 105 and the high voltage junction terminating structure 111.

More specifically, as described in Imam et al., the optimum impurity concentration of the n$^-$ type diffusion region 1 to obtain a desired breakdown voltage is at most $1.4\times10^{12}/cm^2$ for a single RESURF structure. An impurity concentration higher than this value cannot ensure sufficient breakdown voltage. For the double RESURF structure, the optimum impurity concentration of the n$^-$ type diffusion region 1 to ensure the breakdown voltage between the p type diffusion region 2 and the n$^-$ type diffusion region 1 is at most $2.8\times10^{12}/cm^2$. In order to ensure a desired breakdown voltage, an impurity concentration of the p type diffusion region is at most $1.4\times10^{12}/m^2$ and at the same time it is necessary that the difference between the impurity concentrations in the p type diffusion region 2 and in the n$^-$ type diffusion region 1 is at most $1.4\times10^{12}/cm^2$. These conditions for the impurity concentration of the p type diffusion region 2 is necessary conditions to obtain a desired breakdown voltage and not a sufficient condition. To obtain a desired breakdown voltage, optimization is needed to the impurity concentration of the p type diffusion region 2 while satisfying the above-mentioned necessary conditions. The optimum impurity concentration of the p type diffusion region 2 depends on the impurity concentration of the n$^-$ type diffusion region 1; a low impurity concentration for the n$^-$ type diffusion region 1 leads to lower optimum impurity concentration of the p type diffusion region 2.

A lower impurity concentration of the n$^-$ type diffusion region 1 tends to lower the optimum impurity concentration of the p type diffusion region 2 because the amount of positive space charges in the depletion layer has to be balanced with the amount of negative space charges. Therefore, a low impurity concentration of the n$^-$ type diffusion region 1 means a small amount of positive space charges, which are donors, in the n$^-$ type diffusion region 1, reducing the negative space charges, which are acceptors, allowed in the depletion layer of the p type diffusion region 2. When the impurity concentration in the p type diffusion region 2 is higher than the impurity concentration of the n$^-$ type diffusion region 1, deficiency of the positive space charges causes incomplete depletion of the p type diffusion region 2, resulting in insufficient breakdown voltage.

Negative space charges in a depletion layer exist not only in the depletion layer extending from pn junction between the p type diffusion region 2 and the n$^-$ diffusion region 1 into the p type diffusion region 2, but also exist in an approximately same amount in the depletion layer extending from the pn junction between the p type semiconductor substrate and the n$^-$ type diffusion region 1 into the p type semiconductor substrate. Consequently, in order to make the p type diffusion region 2 thoroughly depleted, the amount of the positive space charges in the n$^-$ type diffusion region 1 has to be about twice the amount of the negative space charges in the p type diffusion region 2. Therefore, the optimum impurity concentration in the p type diffusion region 2 for ensuring a sufficient breakdown voltage is about half the impurity concentration in the n$^-$ type diffusion region 1.

For this reason, a design condition to ensure a sufficient breakdown voltage in the nch MOSFET 105 and the high voltage junction terminating structure 111 with a single RESURF structure, a single RESURF condition, is that an impurity concentration Nd per unit area of the n$^-$ diffusion region 1 (hereinafter referred to simply as an impurity concentration of the n$^-$ diffusion region 1) is at most $1.4\times10^{12}/cm^2$, or the inequality $Nd \leq 1.4\times10^{12}/cm^2$ holds. A double RESURF condition for the pch MOSFET 108 with a double RESURF structure to ensure a sufficient breakdown voltage is to satisfy the following four conditions.

The first condition is that the impurity concentration Nd of the n$^-$ type diffusion region 1 is about twice the impurity concentration Na of the p type diffusion region 2, or $Nd \approx 2\times Na$. The second condition is that the impurity concentration Na of the p type diffusion region 2 is at most $1.4\times10^{12}/cm^2$ (Na$\leq 1.4\times10^{12}/cm^2$). The third condition is that the impurity concentration Nd of the n⁻ type diffusion region 1 is at most $2.8\times10^{12}/cm^2$ (Nd$\leq 2.8\times10^{12}/cm^2$). The fourth condition is that the difference between the impurity concentration Nd of the n⁻ type diffusion region 1 and the impurity concentration Na of the p type diffusion region 2 is at most $1.4\times10^{12}/cm^2$ (Nd−Na$\leq 1.4\times10^{12}/cm^2$).

As a consequence, in a conventional HVIC 100, the condition for ensure a sufficient breakdown voltage is to satisfy both the single RESURF condition and the double RESURF condition. More specifically, both the single RESURF condition and the double RESURF condition are satisfied when the following two conditions are satisfied: firstly, the impurity concentration Nd of the n⁻ type diffusion region 1 is at most $1.4\times10^{12}/cm^2$ (Nd$\leq 1.4\times10^{12}/cm^2$); secondly, the impurity concentration Na of the p type diffusion region 2 is at most $7.0\times10/cm^2$ (Na$\leq 7.0\times10^{11}/cm^2$).

In order for the nch MOSFET 105 and the high voltage junction terminating structure 111 with a single RESURF structure to have a sufficient breakdown voltage, the impurity concentration Nd of the n⁻ type diffusion region 1 needs to be at most $1.4\times10^{12}/cm^2$. The impurity concentration Na of the p type diffusion region 2 is necessarily at most $7.0\times10^{11}/cm^2$. When the impurity concentration Na of the p type diffusion region 2 is at a value approximately $7.0\times10^{11}/cm^2$, the pch MOSFET 108 cannot have a sufficient current carrying capacity because of the problems of a high drift resistance in the p type diffusion region 2 and the pinch-off of the p type diffusion region 2.

On the other hand, if the impurity concentration Na of the p type diffusion region 2 is raised in order for the pch MOSFET 108 with a double RESURF structure to exhibit sufficiently high current carrying capacity, the pch MOSFET 108 cannot have a sufficiently high breakdown voltage. In short, the conventional HVIC 100 is hardly provide optimum condition for both the current carrying capacity and breakdown voltage of the pch MOSFET 108. When the impurity concentration Nd of the n⁻ type diffusion region 1 is a low value of about $1.0\times10^{12}/cm^2$, at the pn junction between the n⁻ type diffusion region 1 and the p type diffusion region 2, an electric field is generated in the direction from the p type diffusion region 2 toward the p type semiconductor substrate 10, creating a leakage current to the p type semiconductor substrate 10. Thus, a breakdown voltage is hardly ensured between the p type diffusion region 2 and the p type semiconductor substrate 10.

As described later, in order to ensure a breakdown voltage between the p type diffusion region 2 and the p type semiconductor substrate 10, the impurity concentration Nd of the n⁻ type diffusion region 1 in the pch MOSFET 108 should be at least $1.3\times10^{12}/cm^2$. Because a p type diffusion region 2 is formed on the surface of the n⁻ type diffusion region 1 of the pch MOSFET 108, the impurity concentration of the n⁻ type diffusion region 1 of the pch MOSFET, when formed by ion implantation homogeneous over the surface as usual, becomes lower than those of the n⁻ diffusion regions 1 of the nch MOSFET 105 and the high voltage junction terminating structure 111. As commonly employed, when a diffusion depth of the p type diffusion region 2 is in the range of 1 μm to 2 μm, and the diffusion depth of the n⁻ type diffusion region 1 is in the range of 10 μm to 30 μm, the impurity concentration of the n⁻ type diffusion region 1 of the pch MOSFET 108 is lower by more than 10% than the impurity concentration of the nch MOSFET 105 and the n⁻ type diffusion region 1 of the high voltage junction terminating structure 111.

As a consequence, even when the impurity concentration of the n⁻ type diffusion region 1 of the nch MOSFET 105 and the impurity concentration of the n⁻ type diffusion reign 1 of the high voltage junction terminating structure 111 are set at the upper limit value of $1.4\times10^{12}/cm^2$, the impurity concentration of the n⁻ type diffusion region 1 of the pch MOSFET 108 becomes lower than $1.3\times10^{12}/cm^2$. Therefore, in order to adjust the impurity concentrations of the n⁻ type diffusion regions 1 of the pch MOSFET 108, the nch MOSFET 105, and the high voltage junction terminating structure 111 to be a value of at least $1.3\times10^{12}/cm^2$ and at most $1.4\times10^{12}/cm^2$, which is required by the double RESURF condition, the ion implantation processes are carried out separately for the n⁻ type diffusion region 1 for the pch MOSFET 108, and for the nch MOSFET 105 and the high voltage junction terminating structure 111. This causes increased process cost.

Yoshino et al. '2010 discloses a method of increasing the impurity concentration of the p type diffusion region 2 keeping a sufficient breakdown voltage to ensure a high current carrying capacity of the pch MOSFET 108 while maintaining the high breakdown voltage. This is achieved by a p type diffusion region 2 in a configuration of stripes for easy depletion. This method of the Yoshino et al. '2010, however, decreases the area of the drift region of p type diffusion region 2. Accordingly, in order to ensure a required current carrying capacity, the channel width of the pch MOSFET 108 needs to be sufficiently large, wherein the channel width is a width, in the direction perpendicular to the direction from a p⁺ type drain region 27 to the source region, of the channel, or a p type inversion layer generated in the n⁻ diffusion region 1 at the place between a source region of a p type diffusion region 24 and a drift region of the p type diffusion region 2 in an ON state. The enlarged channel width of the pch MOSFET 108 causes a large parasitic capacitance of the pch MOSFET 108, which increases the displacement current associated with dV/dt surge voltage, which may cause malfunctioning of the HVIC.

Yoshino et al. '2013 discloses a method for ensuring a high breakdown voltage between the p type diffusion region 2 and the p type semiconductor substrate 10 in a structure having the p type diffusion region 2 of a stripe shape. However, Yoshino et al. '2013 fails to disclose a method for ensuring a high breakdown voltage between the p type diffusion region 2 and the p type semiconductor substrate 10 in a structure having the p type diffusion region 2 of a conventional structure without a stripe shape.

SUMMARY

Embodiments of the present invention include a semiconductor device, which has a high voltage junction terminating structure and a high voltage p-channel insulated gate type field effect transistor on a single chip, the semiconductor device ensuring optimum condition for a high breakdown voltage of the semiconductor device and a large current carrying capacity of the p-channel insulated gate type field effect transistor.

A semiconductor device according to an embodiment of the present invention is characterized by the following features. A semiconductor device of the invention includes a first field effect transistor of a first conductivity type, the first field effect transistor of a first conductivity type including: a first semiconductor region of a second conductivity type, a second semiconductor region of a first conductivity type, a third semiconductor region of the first conductivity type, a fourth semiconductor region of the first conductivity type, a first gate electrode, a first electrode, and a second electrode. The first semiconductor region is disposed on a semiconductor substrate of a first conductivity type or formed on a surface layer of the semiconductor substrate of the first conductivity type. The second semiconductor region is selectively formed on a surface layer of the first semiconductor region. The third semiconductor region of the first conductivity type is selectively formed on the surface layer of the first semiconductor region and separated from the second semiconductor region. The first gate electrode is formed on a surface of a portion of the first semiconductor region between the second semiconductor region and the third semiconductor region intercalating a first gate insulating film. The fourth semiconductor region is selectively formed in the second semiconductor region. The first electrode is in contact with the third semiconductor region. The second electrode is in contact with the fourth semiconductor region. A device element is provided that includes a fifth semiconductor region of the first conductivity type formed on a surface layer of the first semiconductor region, separated from the second semiconductor region and the third semiconductor region. The device element is isolated from the first field effect transistor of the first conductivity type by a part of the first semiconductor region between the second semiconductor region and the fifth semiconductor region. An impurity concentration of the first semiconductor region positioned between the second semiconductor region and the semiconductor substrate is in the range of $1.3 \times 10^{12}/cm^2$ to $2.8 \times 10^{12}/cm^2$. An impurity concentration of the second semiconductor region is in the range of $1.1 \times 10^{12}/cm^2$ to $1.4 \times 10^{12}/cm^2$.

The resistivity of the semiconductor substrate is in the range of 100 Ωcm to 400 Ωcm.

A semiconductor device according to an embodiment of the present invention is characterized by the following features. A semiconductor device of the invention includes a first field effect transistor of a first conductivity type, the first field effect transistor of a first conductivity type comprising: a first semiconductor region of a second conductivity type, a second semiconductor region of a first conductivity type, a third semiconductor region of the first conductivity type, a fourth semiconductor region of the first conductivity type, a first gate electrode, a first electrode, and a second electrode. The first semiconductor region is disposed on a semiconductor substrate of a first conductivity type or formed on a surface layer of the semiconductor substrate of a first conductivity type. The second semiconductor region is selectively formed on a surface layer of the first semiconductor region. The third semiconductor region is selectively formed on the surface layer of the first semiconductor region and separated from the second semiconductor region. The first gate electrode formed on a surface of a portion of the first semiconductor region between the second semiconductor region and the third semiconductor region intercalating a first gate insulating film. The fourth semiconductor region is selectively formed in the second semiconductor region. The first electrode is in contact with the third semiconductor region. The second electrode is in contact with the fourth semiconductor region. A device element is provided that includes a fifth semiconductor region of the first conductivity type formed on a surface layer of the first semiconductor region, separated from the second semiconductor region and the third semiconductor region. The device element is isolated from the first field effect transistor of the first conductivity type by a part of the first semiconductor region between the second semiconductor region and the fifth semiconductor region. An impurity concentration of the first semiconductor region is so determined that when a voltage not higher than a desired breakdown voltage is applied between the third semiconductor region and the fourth semiconductor region, no electric field directing from the second semiconductor region toward the semiconductor substrate is generated at a pn junction between the first semiconductor region and the second semiconductor region.

An impurity concentration of a portion of the first semiconductor region between the second semiconductor region and the semiconductor substrate is in the range of $1.3 \times 10^{12}/cm^2$ to $2.8 \times 10^{12}/cm^2$.

An impurity concentration of the second semiconductor region is in the range of $1.1 \times 10^{12}/cm^2$ to $1.4 \times 10^{12}/cm^2$.

A semiconductor device according to an embodiment of the invention may further include a bipolar transistor that includes: a sixth semiconductor region of the second conductivity type, a seventh semiconductor region of the first conductivity type, an eighth semiconductor region of the second conductivity type, a third electrode, and a fourth electrode. The sixth semiconductor region is selectively formed in a surface layer of the first semiconductor region separated from the second semiconductor region. The seventh semiconductor region is selectively formed within the sixth semiconductor region. The seventh semiconductor region is connected to the second electrode. The eighth semiconductor region is selectively formed within the seventh semiconductor region. The eighth semiconductor region is at a potential of the semiconductor substrate. The third electrode is in contact with the sixth semiconductor region. The fourth electrode is in contact with the eighth semiconductor region. A power supply potential electrode at a higher potential than the semiconductor substrate is provided. A resistor electrically connected to a node between the third electrode and the power supply potential electrode is provided.

The distance between the second semiconductor region and the fifth semiconductor region is at most 5 μm.

The device element may include a field effect transistor of the second conductivity that includes: a ninth semiconductor region of the first conductivity type, a tenth semiconductor region of the second conductivity type, an eleventh semiconductor region of the second conductivity type, a second gate electrode, a fifth electrode, and a sixth electrode. The ninth semiconductor region is selectively formed on the front surface layer of the first semiconductor region and separated from the fifth semiconductor region. The tenth semiconductor region is selectively formed within the ninth semiconductor region. The second gate electrode is formed on the surface of a part of the ninth semiconductor region between the first semiconductor region and the tenth semiconductor region intercalating a second gate insulating film. The eleventh semiconductor region is selectively formed on a front surface layer of the first semiconductor region, separated from the fifth semiconductor region and disposed in an opposite side of the ninth semiconductor region interposing the fifth semiconductor region. The fifth electrode is in contact with the tenth semiconductor region. The sixth electrode is in contact with the eleventh semiconductor region.

The device element may include a second field effect transistor of the first conductivity type that includes: a ninth semiconductor region of the first conductivity type, a tenth semiconductor region of the first conductivity type, a second gate electrode, a fifth electrode, and a sixth electrode. The ninth semiconductor region is selectively formed in the front surface layer of the first semiconductor region, separated from the fifth semiconductor region. The second gate electrode is formed on a part of the first semiconductor region between the fifth semiconductor region and the ninth semiconductor region intercalating a second gate insulating film. The tenth semiconductor region is selectively formed within the fifth semiconductor region. The fifth electrode is in contact with the ninth semiconductor region. The sixth electrode is in contact with the tenth semiconductor region.

The distance between the second semiconductor region and the fifth semiconductor region is in the range of 3 μm to 10 μm.

The second semiconductor region and the fifth semiconductor region have substantially the same impurity concentration.

A semiconductor device according to an embodiment of the present invention provides a semiconductor device that has a high voltage junction terminating structure and a high voltage p-channel insulated gate type field effect transistor on a single chip and ensures optimum condition for a high breakdown voltage of the semiconductor device and a large current carrying capacity of the p-channel insulated gate type field effect transistor.

DETAILED DESCRIPTION OF ILLUSTRATED EMBODIMENTS

Embodiment examples of the present invention will be described in detail in the following with reference to the accompanying drawings. In this specification and the accompanying drawings, the layers and regions preceded by the letter n or p means that their majority carriers are electrons or positive holes, respectively. The sign "+" or "−" following the letter n or p means that the layer or region with the sign has a higher or lower impurity concentration than the one without the sign. In the following description on embodiment examples and accompanying drawings, the similar components are given the same symbol and repeated description thereon is omitted.

First Embodiment

Figure 15:
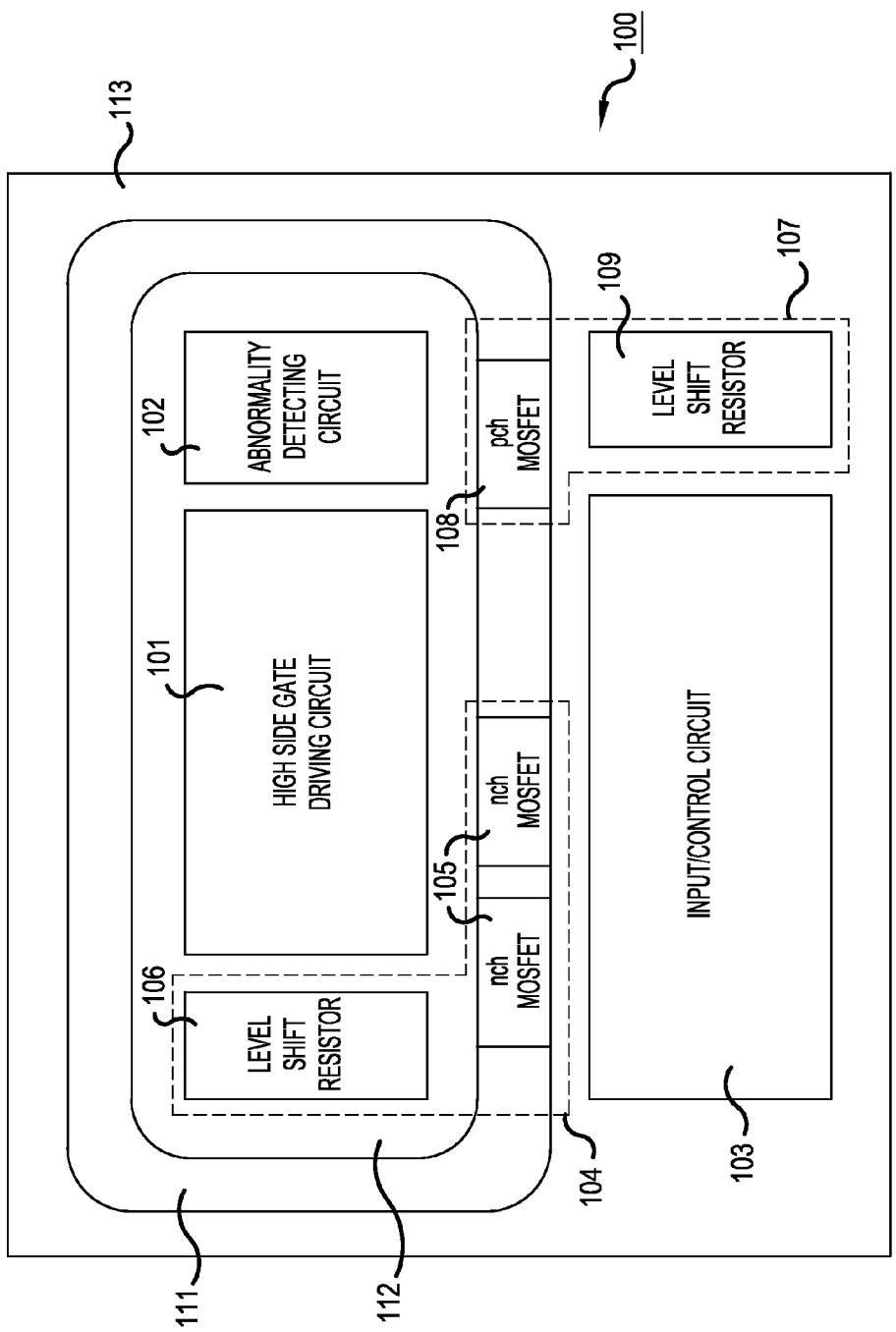
FIG. 15 is a plan view showing an overall layout of a conventional HVIC.
Figure 16:
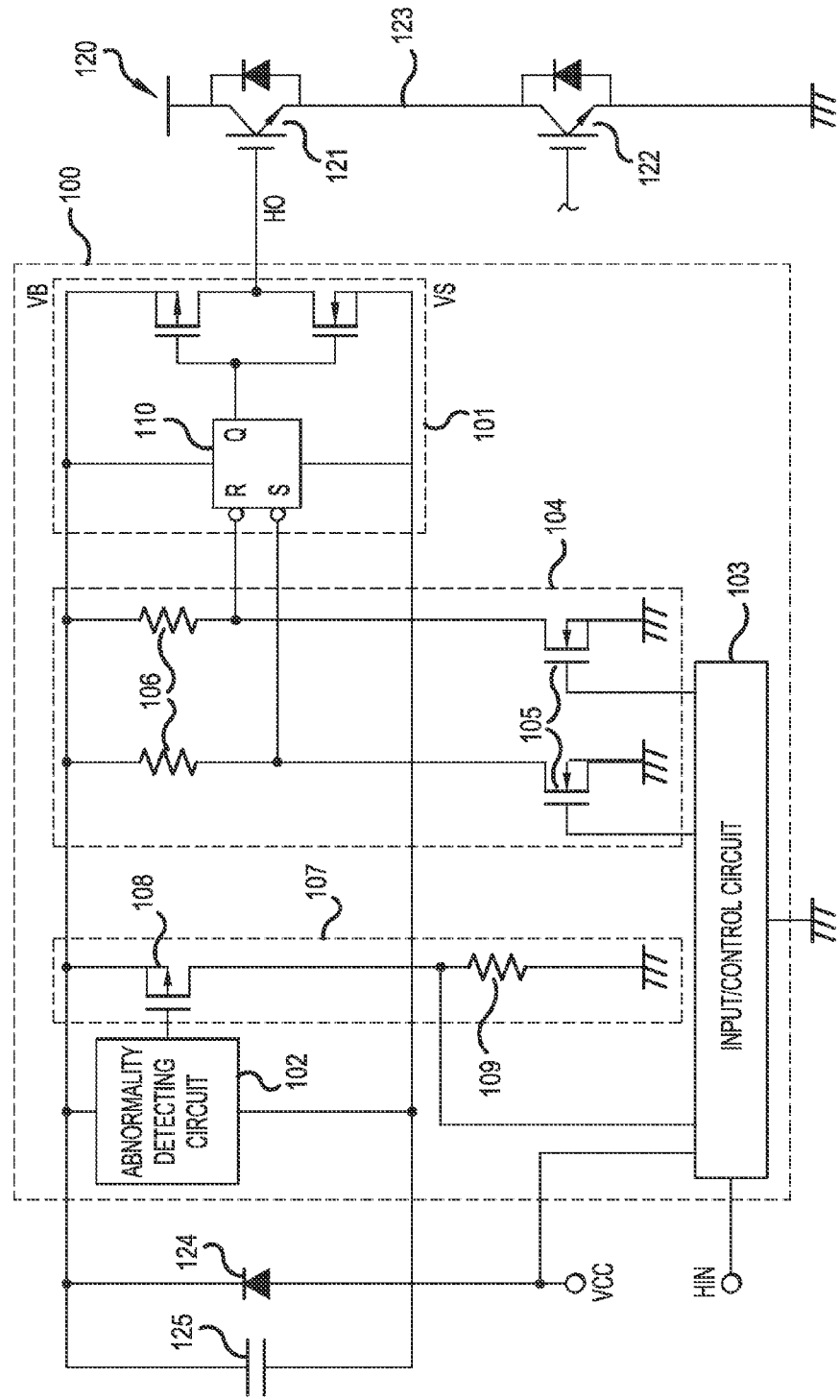
FIG. 16 is a circuit diagram showing the circuit construction of the HVIC depicted in FIG. 15.
Figure 17:
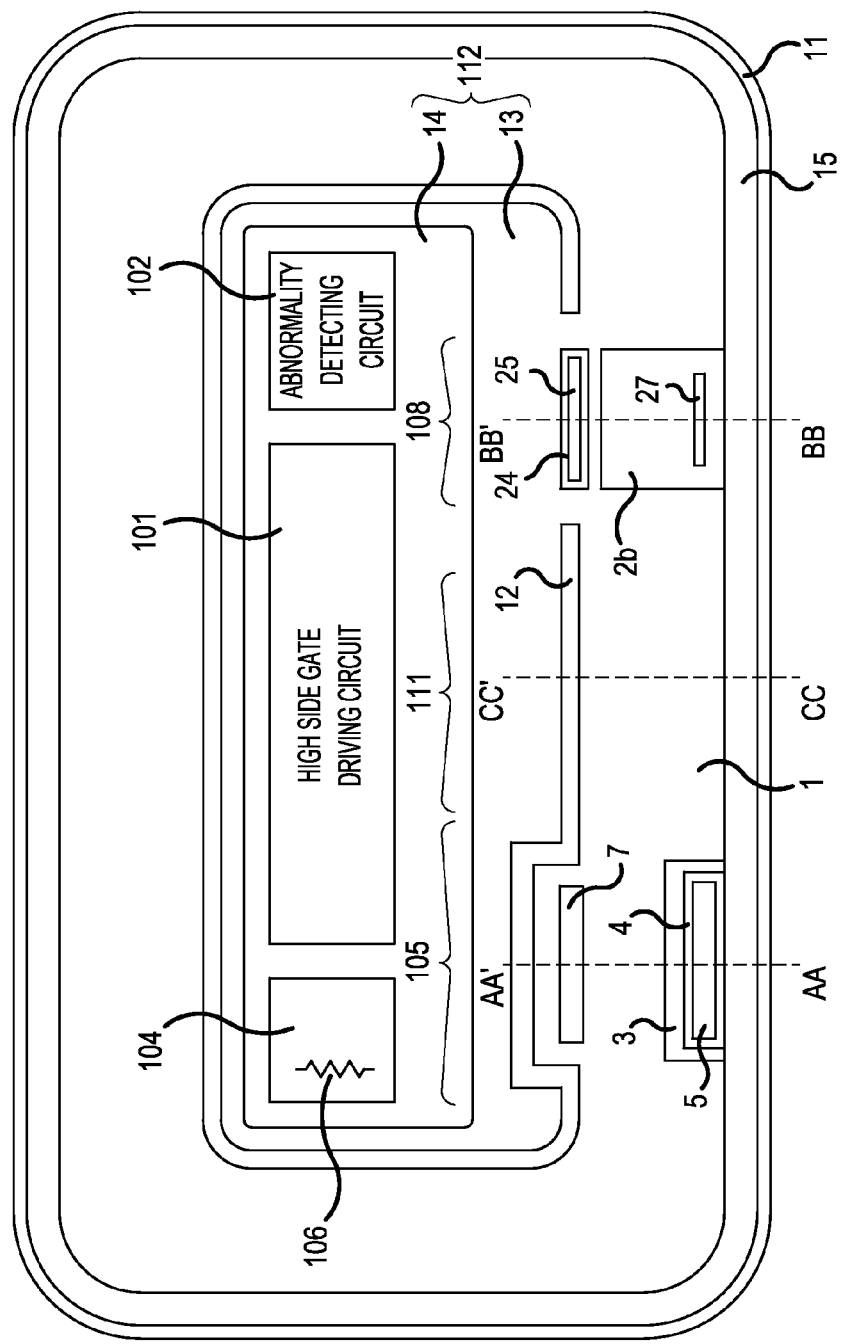
FIG. 17 is a planar view showing in detail a planar construction in a high side well region and the surroundings of the HVIC depicted in FIG. 15.
Figure 18:
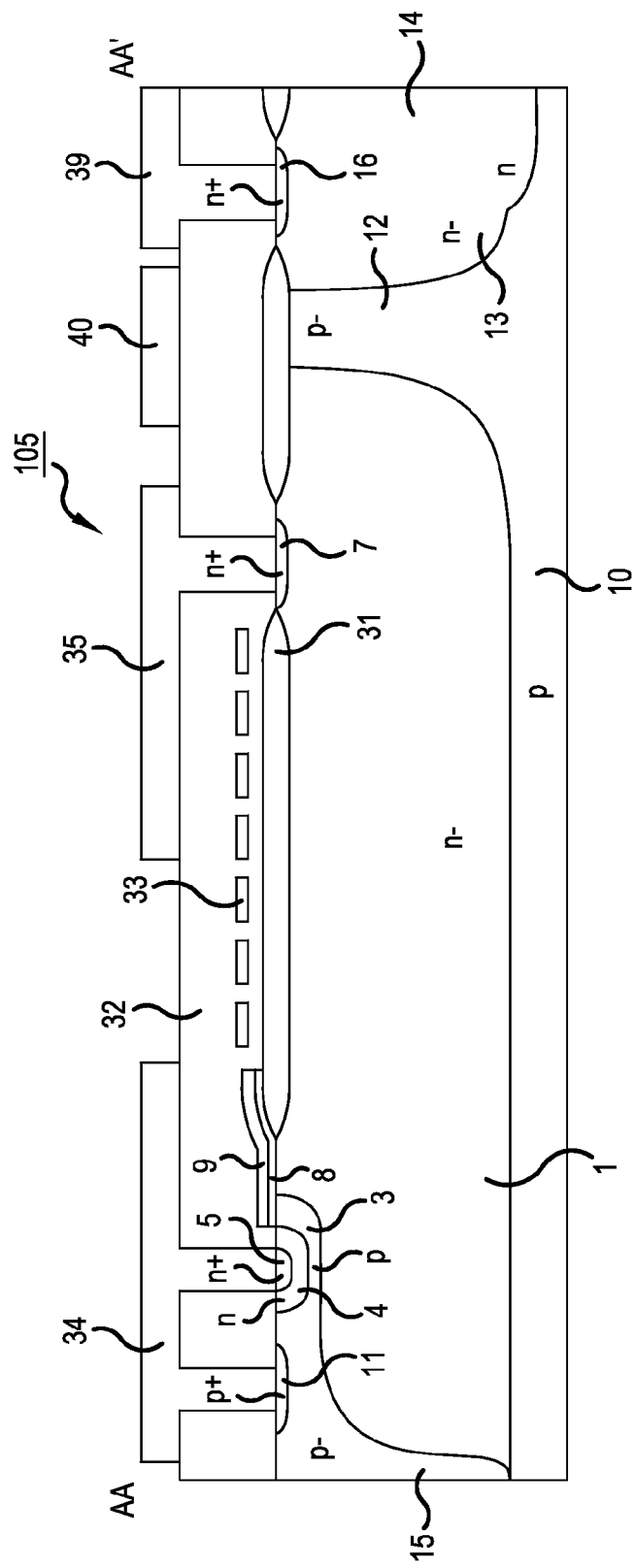
FIG. 18 is a sectional view showing the sectional construction along the line AA-AA' indicated in FIG. 17.
Figure 19:
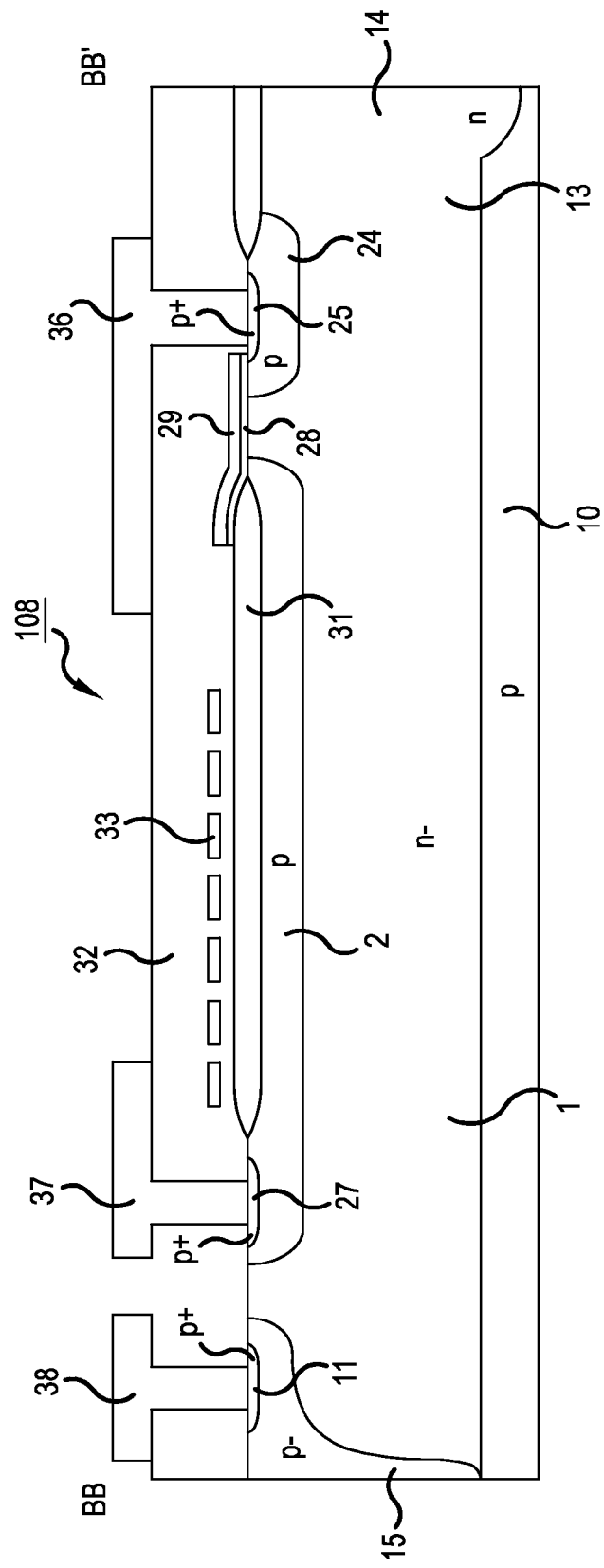
FIG. 19 is a sectional view showing the sectional construction along the line BB-BB' indicated in FIG. 17.
Figure 20:
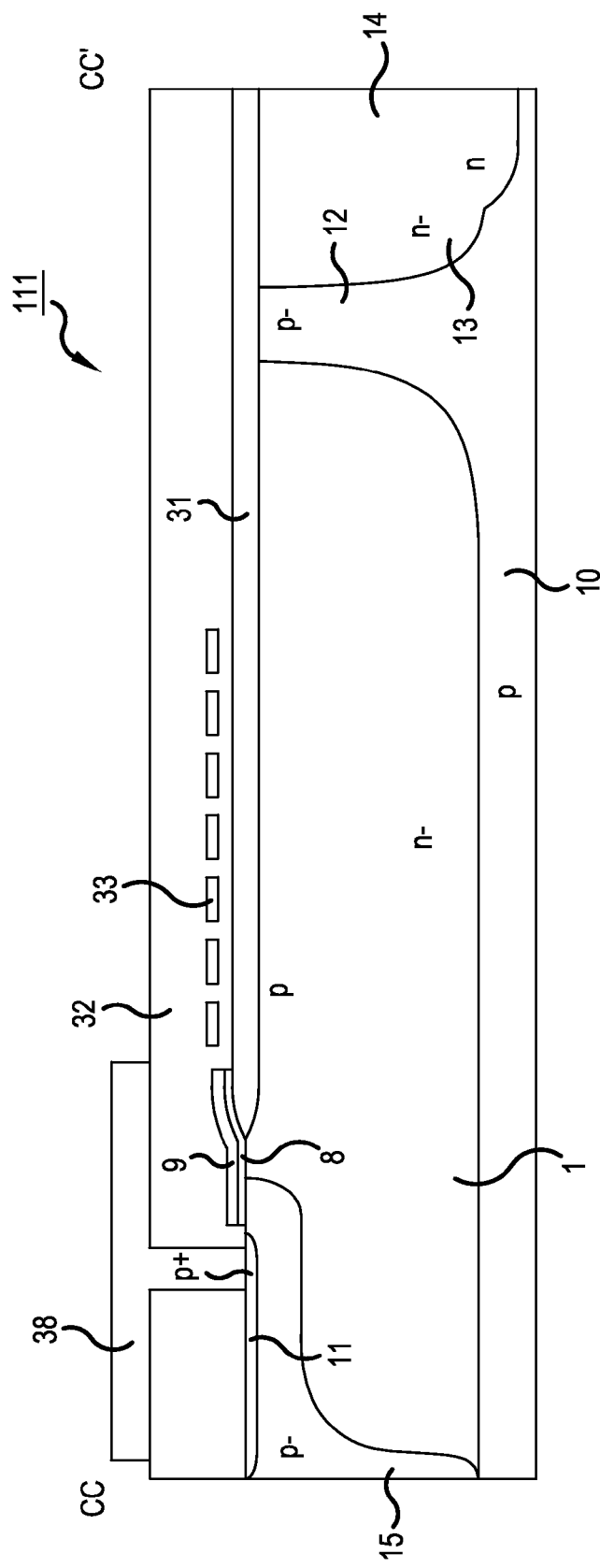
FIG. 20 is a sectional view showing the sectional construction along the line CC-CC' indicated in FIG. 17.

The following describes the construction of the high voltage integrated circuit device (HVIC) of the First Embodiment. The overall circuit construction of the HVIC of the First Embodiment is similar to that of the conventional HVIC 100 shown in FIG. 15 and FIG. 16. The HVIC of First Embodiment includes, in a single semiconductor chip, a high side gate driving circuit 101, an abnormality detecting circuit 102, an input/control circuit 103, a level shift-up circuit 104, a level shift-down circuit 107, and a high voltage junction terminating (HVJT) structure 111, as shown in FIG. 15. The HVIC drives, for example, a first IGBT 121 of the first and second IGBTs 121 and 122 composing one phase of a bridge circuit 120 of a power converter, as shown in FIG. 16.

Figure 1:
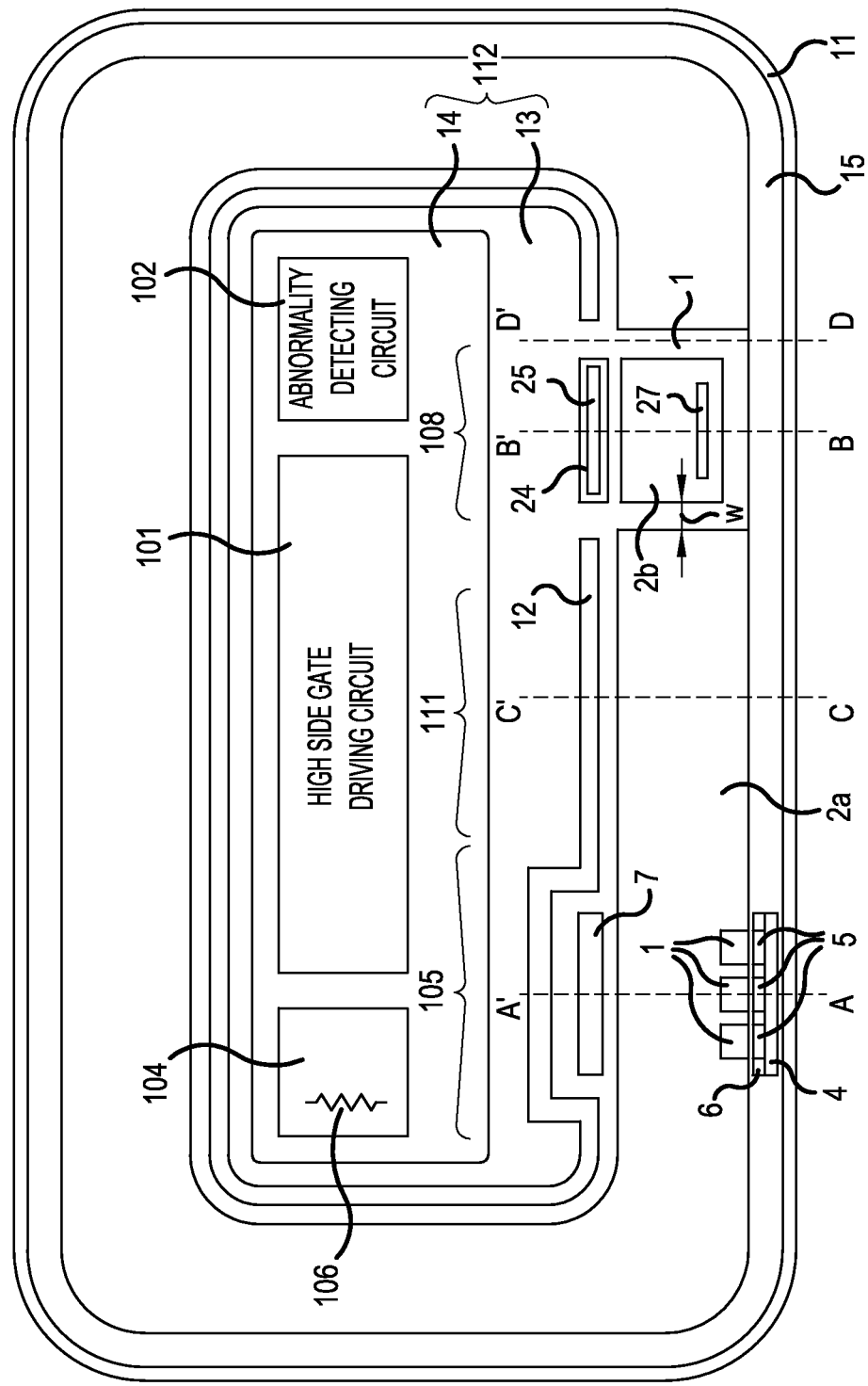
FIG. 1 is a plan view showing the planar structure of an HVIC according to First Embodiment.
Figure 10:
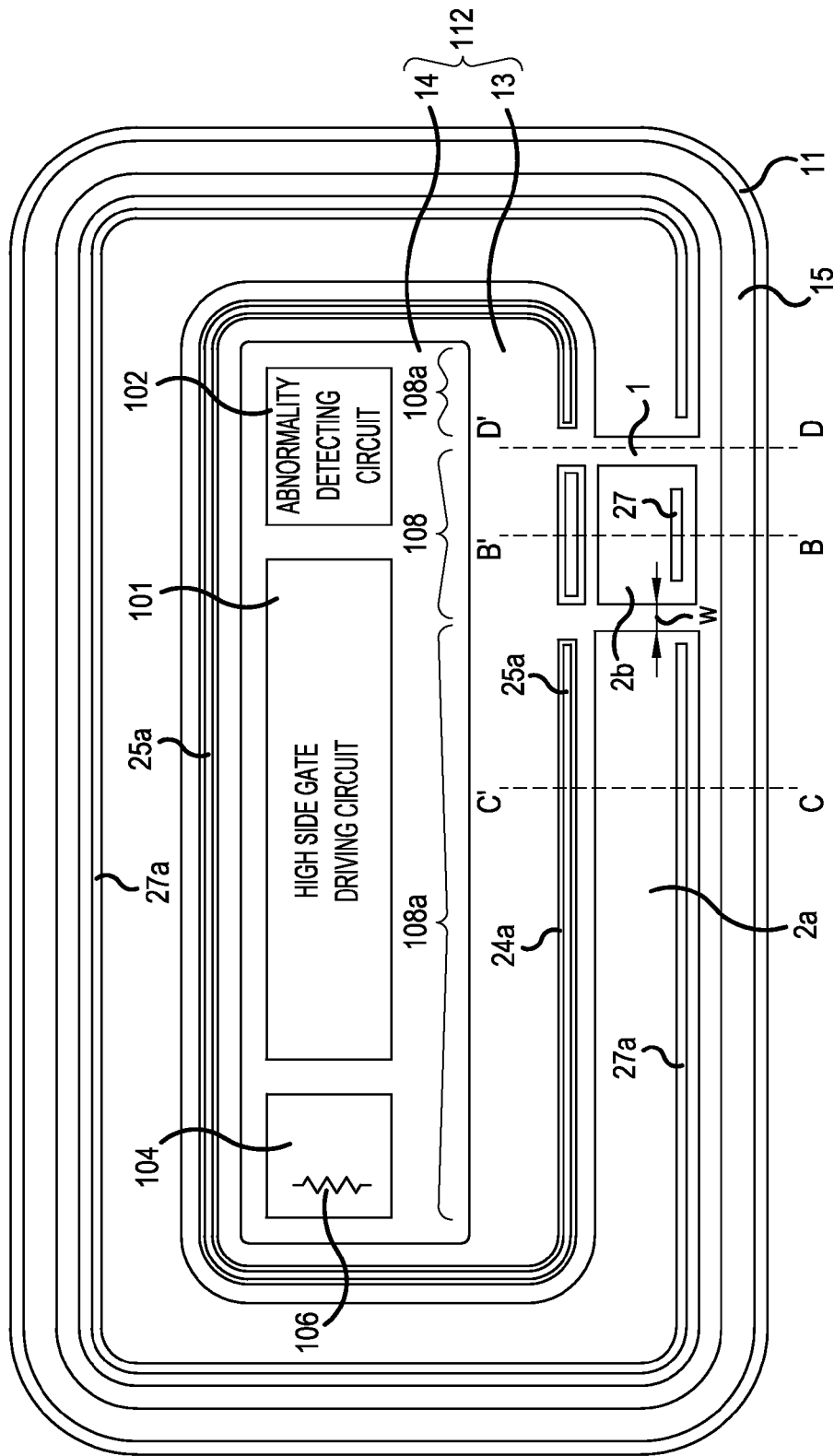
FIG. 10 is a plan view showing a planar structure of an HVIC according to the second embodiment.
Figure 12:
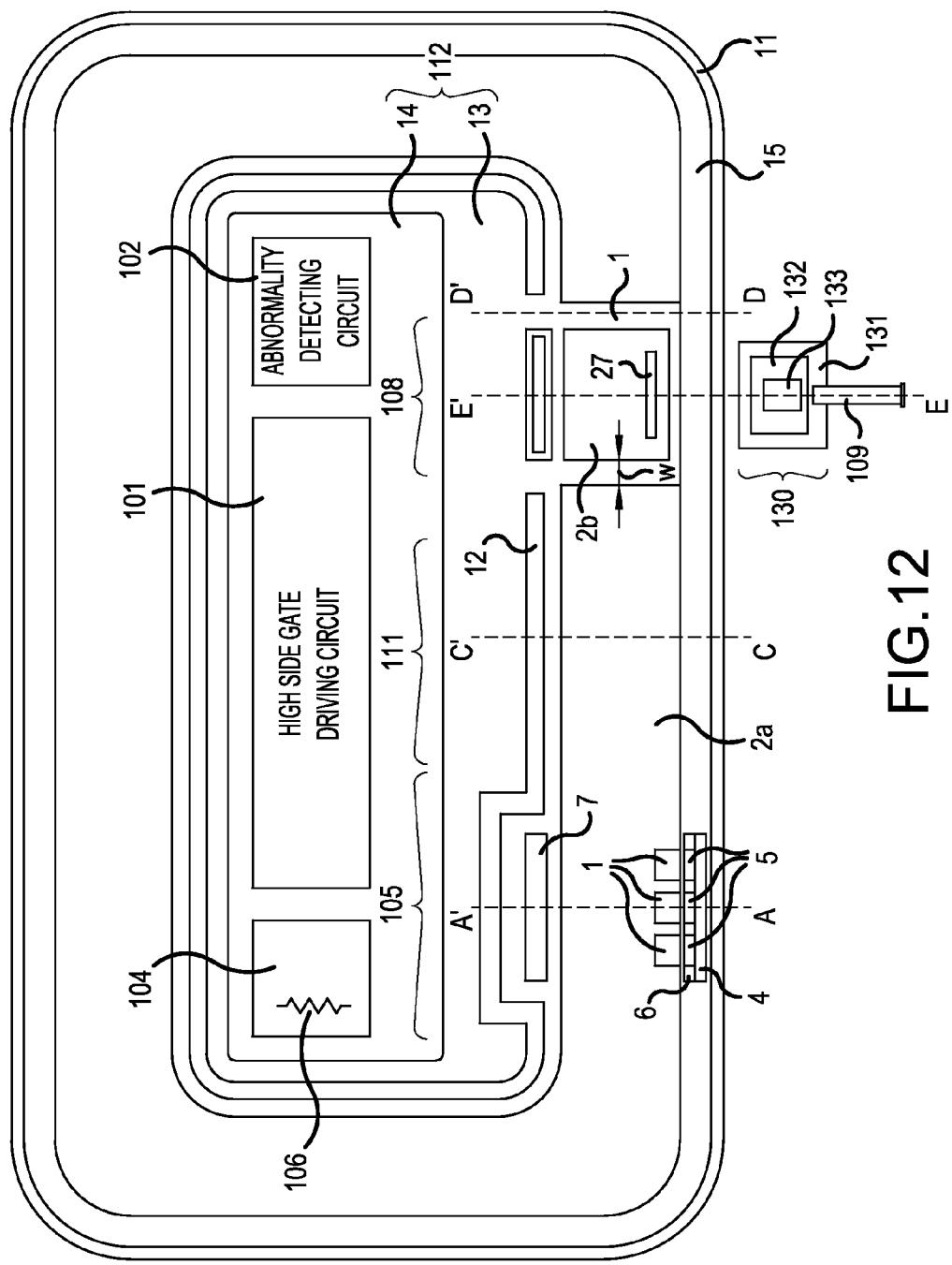
FIG. 12 is a plan view showing a planar structure of an HVIC according to the third embodiment.

The HVIC of First Embodiment differs from the conventional HVIC 100 in that the high voltage junction terminating structure 111 and the nch MOSFET 105, which is a field effect transistor of a second conductivity type, of the level shift-up circuit 104 have, like the pch MOSFET 108, which is a first field effect transistor of a first conductivity type, of the level shift-down circuit 107, a double RESURF structure with a first p type diffusion region 2a, which is a fifth semiconductor region, provided in the n⁻ type diffusion region 1, which is a first semiconductor region. First, description will be made about the planar construction of the peripheral portion of the high side well region 112 including a high side gate driving circuit 101 and other components of the HVIC of First Embodiment. FIG. 1 is a planar view showing a planar construction of the HVIC of First Embodiment. FIG. 1 shows in detail a planar construction of the peripheral portion of the high side well region 112. FIG. 10 and FIG. 12 also show planar constructions of other high side well regions in detail.

As shown in FIG. 1, on a semiconductor chip provided as an n⁻ type diffusion region 1 composing a high voltage junction terminating structure 111, an n⁻ diffusion region 13 and an n type diffusion region 14 composing the high side well region 112, and a not depicted low side region. The n type diffusion region 14 can accommodate a high side gate driving circuit 101, an abnormality detecting circuit 102, and a level shift-up circuit 104 including a level shift resistor 106 but excluding an nch MOSFET 105. The n⁻ type diffusion region 13 surrounds the n type diffusion region 14. The n⁻ type diffusion region 13 and the n type diffusion region 14 are connected to a VB potential, which is the highest potential of the high side well region 112.

The n⁻ type diffusion region 1 is a high voltage region electrically isolated from a low side region by a p⁺ GND region 11, which is described later, and disposed surrounding the n⁻ type diffusion region 13. The n⁻ type diffusion region 13 is selectively isolated from the n⁻ type diffusion region 1, for example, by a p⁻ type diffusion region 12, which is an isolating region, having a ring planar shape with roughly a shape of the letter C. The high side well region 112, which includes the n⁻ type diffusion region 13 and the n type diffusion region 14, is electrically isolated from the n⁻ type diffusion region 1 at the place of the isolating region 12. The isolation between the high side well region 112 and the n⁻ type diffusion region 1 by the isolation region 12 reduces the leakage current from the n type diffusion region 14 to the n⁻ type diffusion region 1 upon turning ON of the nch MOSFET 105.

In the portion of the n⁻ type diffusion region 1 that is isolated from the high side well region 112 by the isolating region 12, an nch MOSFET 105 of the level shift-up circuit 104 and the high voltage junction terminating structure 111 are provided. In the portion of the n⁻ type diffusion region 1 that is in contact with the n⁻ type diffusion region 13, a pch MOSFET 108 of the level shift-down circuit 107 is disposed. The nch MOSFET 105 and the pch MOSFET 108 may be disposed as distant as possible from circuits arranged on the low side region in order to avoid interference in signal transmission.

Although FIG. 1 shows only a single nch MOSFET 105 of the level shift-up circuit 104, another nch MOSFET 105 is also disposed in the portion of the n⁻ type diffusion region 1 that is isolated from the high side well region 112 by the isolation region 12. Although the high voltage junction terminating structure 111 is depicted as a part between the nch MOSFET 105 and the pch MOSFET 108, the whole part in the n⁻ type diffusion region 1 is the high voltage junction terminating structure 111 excepting the portions of the nch MOSFET 105 and the pch MOSFET 108. In other words, the nch MOSFET 105 and the pch MOSFET 108 are incorporated together in the high voltage junction terminating structure 111.

In the n⁻ type diffusion region 1, a first p type diffusion region 2a and a second p type diffusion region 2b are provided composing a double RESURF structure over the almost whole region of the n⁻ type diffusion region 1. More specifically, the first p type diffusion region 2a is disposed over the portion of the n⁻ type diffusion region 1 in which the nch MOSFET 105 and the high voltage junction terminating structure 111 are disposed. The second p type diffusion region 2b, which is a second semiconductor region, is disposed on the portion of the n⁻ type diffusion region 1 in which the pch MOSFET 108 is disposed, the second p type diffusion region 2b being separated from the first p type diffusion region 2a. The first p type diffusion region 2a and the second p type diffusion region 2b are disposed with a predetermined gap w between the two and are separated by the portion of the n⁻ type diffusion region 1 exposing to the front surface of the substrate between the first p type diffusion region 2a and the second p type diffusion region 2b. The first p type diffusion region 2a and the second p type diffusion region 2b may be formed with the same conditions of, for example, a diffusion depth and an impurity concentration. This is because the same conditions can provide the same double RESURF conditions for the nch MOSFET 105, the pch MOSFET 108, and the high voltage junction terminating structure 111.

The gap w between the first p type diffusion region 2a and the second p type diffusion region 2b may be in a range of 3 μm to 10 μm. The reason for this dimension is as follows. A p⁺ type source region 25, which is a third semiconductor region, of the pch MOSFET 108 is disposed at the substrate center side, which is the side of the high side well region 112, of the second p type diffusion region 2b and faces to the second p type diffusion region 2b interposing the n⁻ type diffusion region 1. The p⁺ type source region 25 can be disposed near a joining surface between the n⁻ type diffusion region 1 and the n type diffusion region 13, the joining surface being at the place of interruption of the isolation region 12 with a roughly C shape. A p⁺ type drain region 27, which is a fourth semiconductor region, of the pch MOSFET 108 is disposed at the outer peripheral side, which is the low side region side, in the second p type diffusion region 2b. The drain current of the pch MOSFET 108 in an ON state thereof flows from the p⁺ source region 25 through the second p type diffusion region 2b to the p⁺ type drain region 27.

If the gap w between the first p type diffusion region 2a and the second p type diffusion region 2b is smaller than 3 μm, the drain current flowing from the p⁺ type source region 25 through the second p type diffusion region 2b to the p⁺ type drain region 27 flows aside from the second p type diffusion region 2b or from the p⁺ type drain region 27 through the n⁻ type diffusion region 1 into the first p type diffusion region 2a and punches-through under the first p type diffusion region 2a, to a p type region in the back surface side of the substrate, generating a leakage current. This p type region in the back surface side of the substrate is a p type region of the semiconductor substrate 10 remained in the deeper region than the n⁻ type diffusion region 1 without forming the n⁻ type diffusion region 1. On the other hand, if the gap w between the first p type diffusion region 2a and the second p type diffusion region 2b is larger than 10 μm, the portion of the n⁻ type diffusion region 1 located between the first p type diffusion region 2a and the second diffusion region 2b cannot be completely depleted, making it difficult to ensure a predetermined breakdown voltage. Therefore, the gap w between the first p type diffusion region and the second diffusion region 2b may be in the range of 3 μm to 10 μm.

The high side well region 112 including the n⁻ type diffusion region 13 and the n type diffusion region 14, and the n⁻ type diffusion region 1, which is a high voltage region, are surrounded by a p⁻ type diffusion region 15 and a p⁺ type diffusion region 11, which is a p⁺ type GND region, disposed in the p⁻ type diffusion region 15, and thus are electrically isolated from the low side region (not depicted) at a lower potential than the high side well region 112. The p⁻ type diffusion region 15 is in contact with the first p type diffusion region 2a and without contact with the second diffusion region 2b. The p⁻ type diffusion region 15 is isolated from the second p type diffusion region 2b by the n⁻ type diffusion region 1 that is exposed to the front surface of the substrate between the p⁻ type diffusion region 15 and the second p type diffusion region 2b. Within the p⁻ type diffusion region 15 provided are a plurality of n⁺ type source regions 5 and p⁺ type contact regions 6 of nch MOSFETs 105.

The n⁺ type source regions 5 and the p⁺ type contact regions 6 are disposed alternately and repeatedly along the joint surface between the first p type diffusion region 2a and the p⁻ type diffusion region 15. At the part of the first p type diffusion region 2a opposing to the n⁺ type source region 5, a part of the n⁻ type diffusion region 1 is exposed to the front surface of the substrate between the p⁻ type diffusion region 15 and the first p type diffusion region 2a. That is, a planar pattern of the part of the first p type diffusion region 2a opposing to the n⁺ type source region 5 and the p⁺ type contact region 6 is a pattern where the n⁻ type diffusion region 1 and the first p type diffusion region 2a are alternately and repeatedly arranged. An n⁺ type drain region 7 of the nch MOSFET 105 is disposed in the central side of the first p type diffusion region 2a, opposing to the n⁺ type source region 5 and the p⁺ type contact region 6 interposing the first p type diffusion region 2a.

Figure 2:
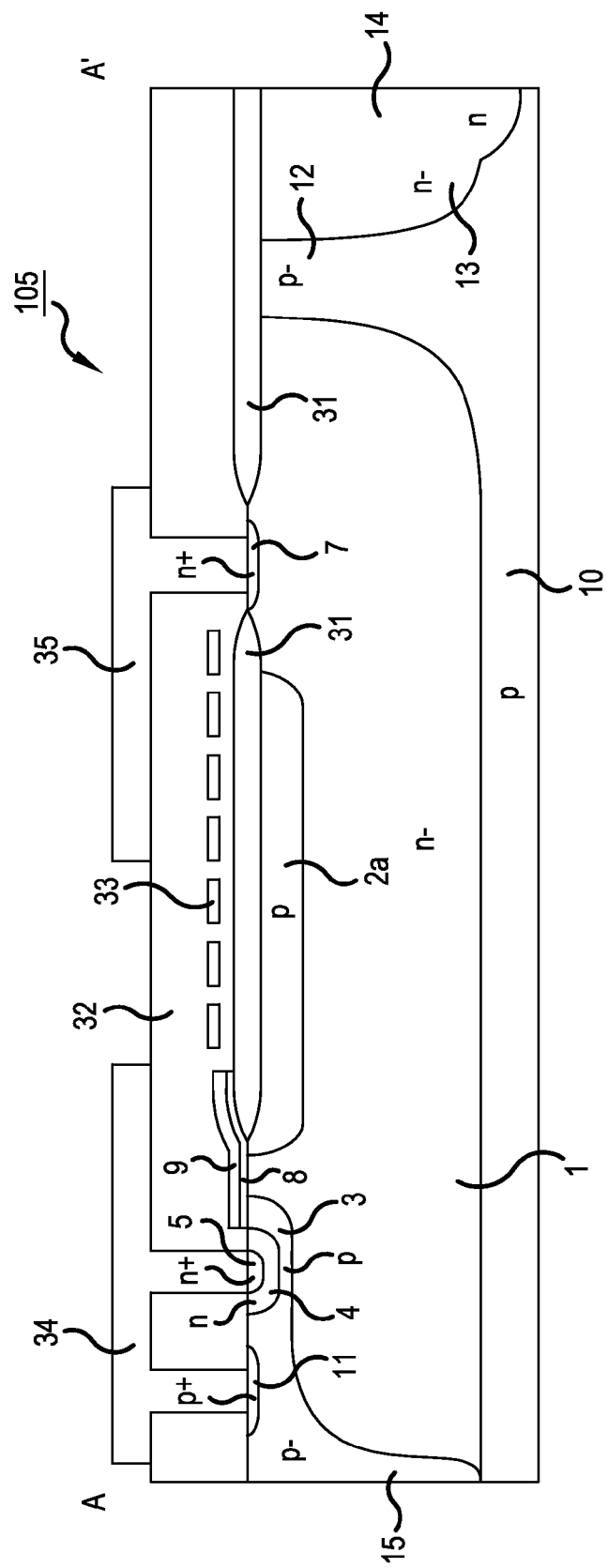
FIG. 2 is a sectional view showing the sectional structure along the line A-A' indicated in FIG. 1.
Figure 3:
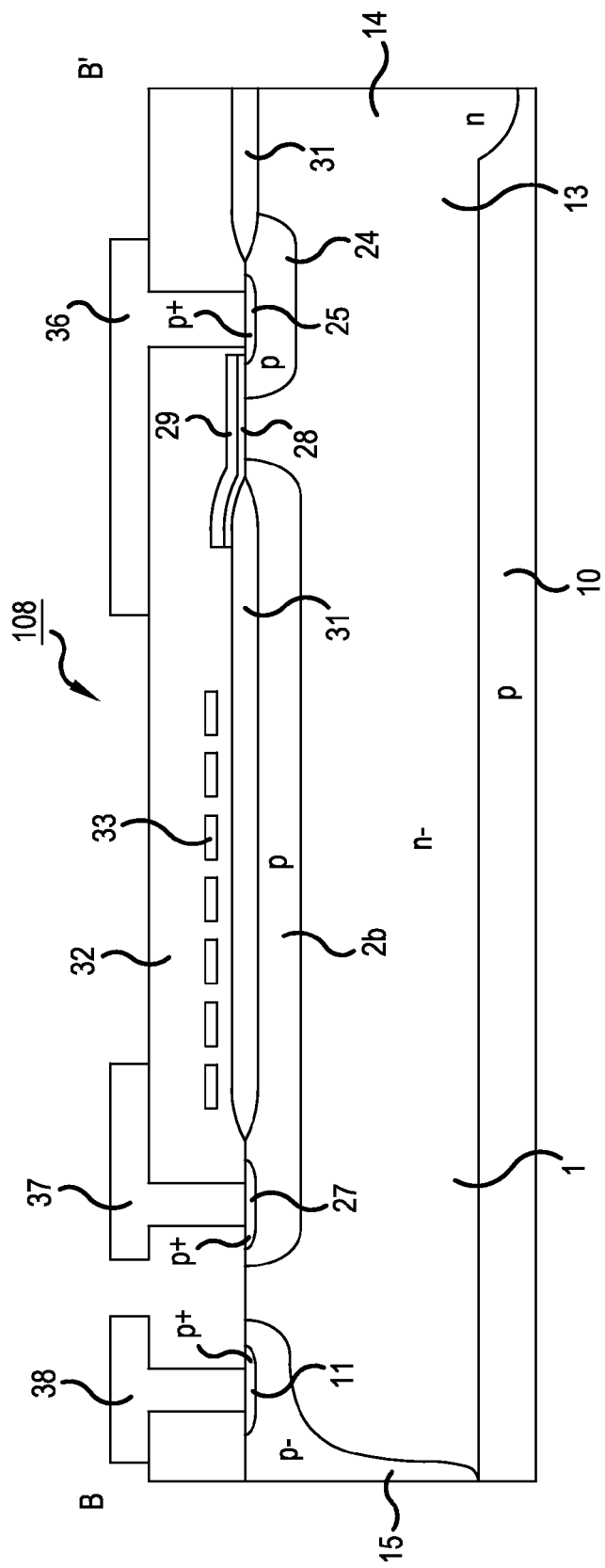
FIG. 3 is a sectional view showing the sectional structure along the line B-B' indicated in FIG. 1.
Figure 4:
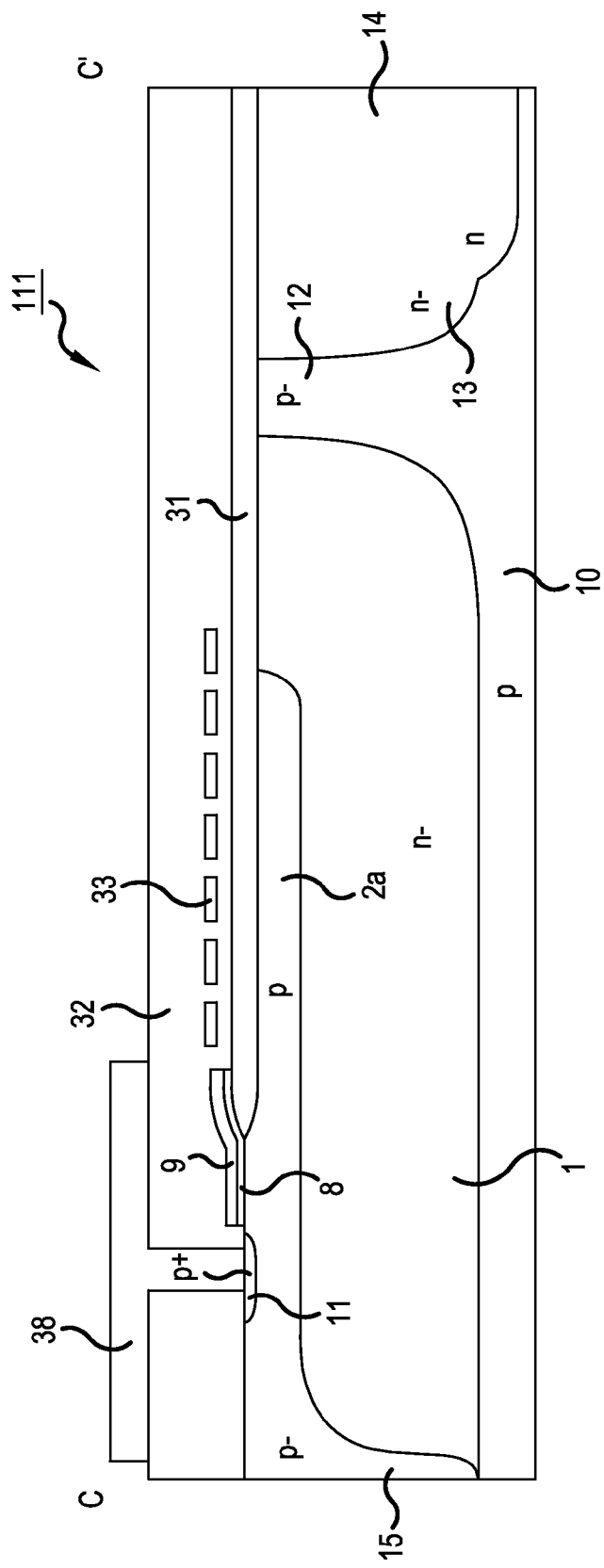
FIG. 4 is a sectional view showing the sectional structure along the line C-C' indicated in FIG. 1.
Figure 5:
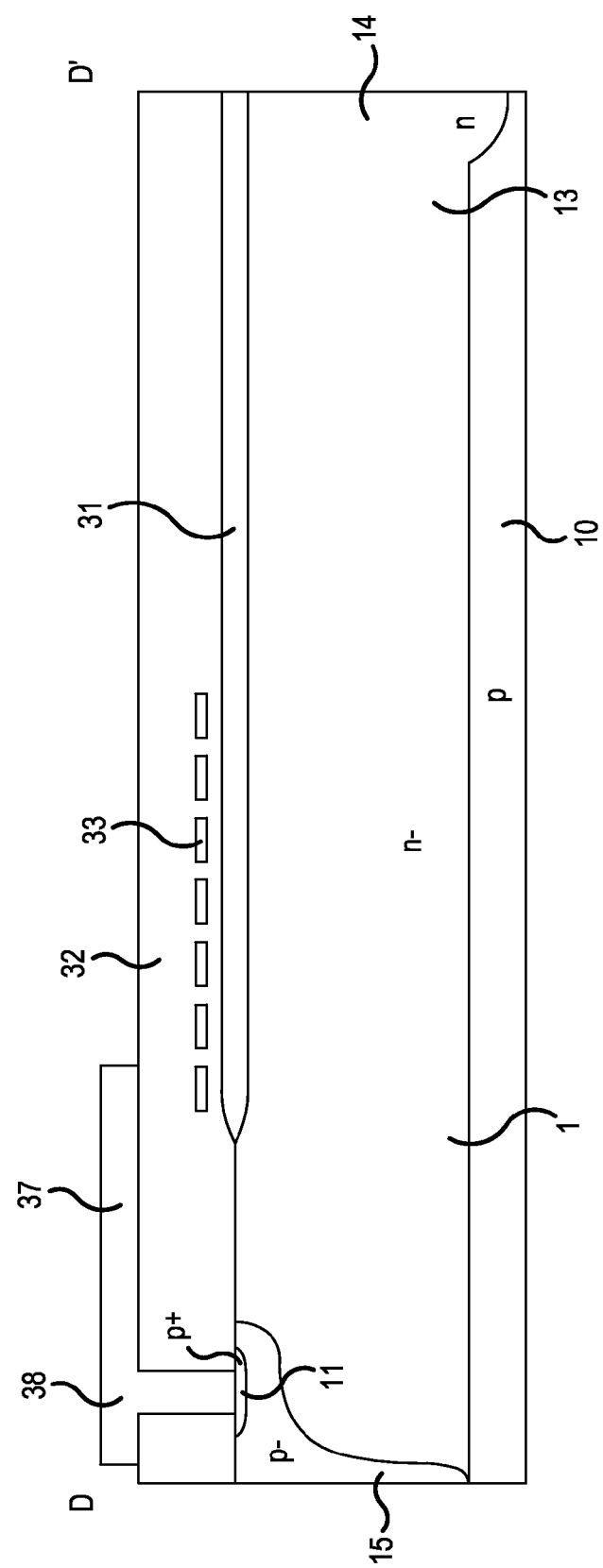
FIG. 5 is a sectional view showing the sectional structure along the line D-D' indicated in FIG. 1.

Now, a sectional construction of the HVIC of First Embodiment is described below. FIG. 2 is a sectional view showing the sectional construction along the line A-A' in FIG. 1; FIG. 3 is a sectional view showing the sectional construction along the line B-B' in FIG. 1; FIG. 4 is a sectional view showing the sectional construction along the line C-C' in FIG. 1; and FIG. 5 is a sectional view showing the sectional construction along the line D-D' in FIG. 1. FIG. 2 illustrates a sectional construction of the nch MOSFET 105; FIG. 3 illustrates a sectional construction of the pch MOSFET 108; FIG. 4 illustrates a sectional construction of the high voltage junction terminating structure 111; and FIG. 5 illustrates a sectional construction of the portion of the n⁻ type diffusion region 1 interposed between the first p type diffusion region 2a and the second p type diffusion region 2b.

Commonly in the sectional views along the cut lines shown in FIGS. 2 to 5, the n⁻ type diffusion region 1, and the n⁻ type diffusion region 13 and the n type diffusion region 14 composing the high side well region 112 are selectively formed in the surface layer on the front surface of the p type semiconductor substrate 10. The n⁻ type diffusion region 13 is disposed in the outer peripheral side of the substrate than the n type diffusion region 14. The n⁻ type diffusion region 13 is disposed in outer peripheral side of the n⁻ type diffusion region 13, which means outer peripheral side of the high side well region 112. The p⁻ type diffusion region 15 is provided in the surface layer of the n⁻ type diffusion region 1 in the front surface side of the substrate in the peripheral side of the substrate. The p⁻ type diffusion region 15 extends in the depth direction through the n⁻ type diffusion region 1 reaching a p type region in the back surface side of the substrate. The p⁻ type diffusion region 15 extends toward the central part of the substrate with a shallower depth than the n⁻ type diffusion region 1. A p⁺ type GND region 11 is selectively formed in the shallow region of the central side of the substrate of the p type diffusion region 15.

First described is a sectional construction of the nch MOSFET 105 of the level shift-up circuit 104. As shown in FIG. 2, the nch MOSFET 105 of the level shift-up circuit 104 has a double RESURF structure comprising the first p type diffusion region 2a, the n⁻ type diffusion region 1 and the p type semiconductor substrates 10, which is a semiconductor chip. The n⁻ type diffusion region 1 simultaneously serves as an n⁻ type drift region. An isolation region 12 is provided between the n⁻ type diffusion region 1 and the n⁻ type diffusion region 13 from the front surface of the substrate with a depth deeper than the n⁻ type diffusion region 1. The isolation region 12 isolates the n⁻ type diffusion region 1 from the n⁻ type diffusion region 13. The reason for the isolation between the n⁻ type diffusion region 1 and the n⁻ type diffusion region 13 by the isolation region 12 in the nch MOSFET 105 is that the drain potential of the nch MOSFET 105 and the VB potential, which is the highest potential in the high side well region 112, have to be isolated from each other in order to flow a current through the level shift resistor 106 in the level shift-up circuit 104.

A p type base region 3, which is a ninth semiconductor region, is provided in the surface layer of the n⁻ type diffusion region 1 in the front surface side of the substrate at the central side of the substrate than the p⁻ type diffusion region 15. The p type base region 3 is in contact with the p⁻ type diffusion region 15. In the p type base region 3 formed are an n⁺ type source region 5, which is a tenth semiconductor region, and a p⁺ type contact region (not depicted in FIG. 2). An n type diffusion region 4 is provided between the p type base region 3 and the n⁺ type source region 5. An n⁺ type drain region 7, which is an eleventh semiconductor region, is formed in the surface layer of the n⁻ type diffusion region 1 in the front surface side of the substrate at a central side of the substrate than the p type base region 3 and separated from the p type base region 3. The first p type diffusion region 2a is provided in the surface layer of the n⁻ type diffusion region 1 in the front surface side of the substrate with a depth shallower than the n⁻ type diffusion region 1. The first p type diffusion region 2a is disposed between the p type base region 3 and the n⁺ type drain region 7 separated away from the p type base region 3 and the n⁺ type drain region 7.

A LOCOS (local oxidation of silicon) film 31 is provided on the surface of the first p type diffusion region 2a and over the surface of the n⁻ type diffusion region 1 at the place between the first p type diffusion region 2a and the n⁺ type drain region 7. The LOCOS film 31 is also provided on the part of the n⁻ type diffusion region 1 in the central side of the n⁺ type drain region 7 and on the substrate surface in the high side well region 112 side. A gate electrode 9, which is a second gate electrode of poly-silicon, for example, is provided through a gate insulation film 8, which is a second gate insulation film, composed of an oxidation film, which can be SiO₂ on the p type base region 3 between the n type diffusion region 4 and the n⁻ type diffusion region 1. The gate electrode 9 is extending over the LOCOS film 31 covering the first p type diffusion region 2a.

In an interlayer dielectric film 32 provided on the front surface of the substrate, a resistor 33, which is a resistive field plate that functions as a field plate, is provided at a position opposing to the first p type diffusion region 2a in the depth direction. The resistive field plate 33 is arranged, for example, in a spiral planar pattern surrounding the high side well region 112. A source electrode 34, which is a fifth electrode, is in contact with the n⁺ source region 5, the n⁺ type contact region, and the p⁺ type GND region 11 through a contact hole penetrating through the interlayer dielectric film 32 in the depth direction. A drain electrode 35, which is a sixth electrode, is in contact with the n⁺ type drain region 7 through a contact hole penetrating through the interlayer dielectric film 32 in the depth direction.

The following describes a sectional construction of the pch MOSFET 108 of the level shift-down circuit 107. As shown in FIG. 3, the pch MOSFET 108 of the level shift-down circuit 107 has a double RESURF structure comprising the second p type diffusion region 2b, the n⁻ type diffusion region 1, and the p type semiconductor substrate 10. In the pch MOSFET 108, the source electrode 36 is connected to the VB potential that is the highest potential of the high side well region 112, so that the pch MOSFET 108 has a construction where the n⁻ type diffusion region 1 is in contact with the n⁻ type diffusion region 13. There is not an isolation region 12 between the n⁻ type diffusion region 1 and the n⁻ type diffusion region 13. In the surface layer of the n⁻ type diffusion region 1 in the front surface side of the substrate, a p type diffusion region 24 is provided at a place in the central side of the substrate than the p⁻ type diffusion region 15. In the p type diffusion region 24, a p⁺ type source region 25 is provided.

The second p type diffusion region 2b is provided in the surface layer of the n⁻ type diffusion region 1 in the front surface side of the substrate with a depth shallower than the n⁻ type diffusion region 1. The second p type diffusion region 2b is disposed between the p type diffusion region 24, or a p⁺ type source region 25, and the p⁻ type diffusion region 15 separated from the p type diffusion region 24 and the p⁻ type diffusion region 15. The second diffusion region 2b not only composes a double RESURF structure, but also functions as a p type drift region. In the second p type diffusion region 2b, a p⁺ type drain region 27 is provided in the side of the p⁻ type diffusion region 15. The p⁺ type drain region 27 is isolated from the p⁻ type diffusion region 15 by the n⁻ type diffusion region 1. The p⁺ type drain region 27 is isolated from the p⁻ type diffusion region 15 because the drain potential of the pch MOSFET 108 has to be isolated from the ground potential in order to flow a current through the level shift resistor 109 of the level shift-down circuit 107.

A LOCOS film 31 is provided on the surface of the second p type diffusion region 2b excepting the place of exposing p+ type drain region 27. The LOCOS film 31 is also provided on the substrate surface in the n type diffusion region 14 side from the p+ type source region 25. On the surface of the n− type diffusion region 1 at the part between the p+ type source region 25 and the second p type diffusion region 2b, a gate electrode 29, which is a first gate electrode made of, for example poly-silicon, through a gate insulating film 28, which is a first gate insulating film, made of, for example $SiO_2$ film. The gate electrode 29 is extending over the LOCOS film 31 covering the second p type diffusion region 2b. In an interlayer dielectric film 32 provided on the front surface of the substrate, a resistive field plate 33 is provided at the place opposing the second p type diffusion region 2b in the depth direction. A source electrode 36, which is a first electrode, is in contact with the p+ type source region 25 through a contact hole penetrating in the depth direction through the interlayer dielectric film 32. A drain electrode 37, which is a second electrode, is in contact with the p+ type drain region 27 through a contact hole penetrating in the depth direction through the interlayer dielectric film 32. A GND electrode 38 is in contact with the p+ type GND region 11.

Then a sectional construction of the high voltage junction terminating structure 111 is described below. As shown in FIG. 4, the high voltage junction terminating structure 111, like the nch MOSFET 105, has a double RESURF structure comprising the first p type diffusion region 2a, the n− type diffusion region 1, and the p type semiconductor substrate 10, which is a semiconductor chip. An isolation region 12 is provided between the n− type diffusion region 1 and the n− type diffusion region 13, and the isolation region 12 isolates the n− type diffusion region 1 from the n− type diffusion region 13. The reason for the isolation between the n− type diffusion region 1 and the n− type diffusion region 13 in the high voltage junction terminating structure 111 is as follows. As described earlier, the part of the n− type diffusion region 1 composing the high voltage junction terminating structure 111 and the part of the n− type diffusion region 1 composing the n− drift region of the nch MOSFET 105 are linked to each other. Consequently, if the n− type diffusion region 1 is in contact with the n− type diffusion region 13 in the high voltage junction terminating structure 111, a leakage current would flow from the VB electrode 39 to the drain electrode 35 of the nch MOSFET 105 through the n− type diffusion region 1. Therefore, the n− type diffusion region 1 and the n−type diffusion region 13 are isolated from each other. The first p type diffusion region 2a is in contact with the p− type diffusion region 15.

Then, a description is made on a sectional construction of the part of the n− diffusion region 1 between the first p type diffusion region 2a and the second p type diffusion region 2b. As shown in FIG. 5, the part of the n− diffusion region 1 between the first p type diffusion region 2a and the second p type diffusion region 2b composes a RESURF structure with the n− type diffusion region 1 and the p type semiconductor substrate 10. In the part of the n− diffusion region 1 between the first p type diffusion region 2a and the second p type diffusion region 2b, an isolation region is not provided between the n− diffusion region 1 and the n− type diffusion region 13, and the n− diffusion region 1 and the n− type diffusion region 13 are in contact with each other. In the part of the n− diffusion region 1 between the first p type diffusion region 2a and the second p type diffusion region 2b, the surface of the n− diffusion region 1 is covered with a LOCOS film 31.

Numerical values of the dimensions and impurity concentrations in the HVIC of First Embodiment can be as follows. The length L, or the width, of the LOCOS film 31 covering the second p type diffusion region 2b in the direction from the p+ source region 25 to the p+ type drain region 27 of the pch MOSFET 108 can be in the range of 100 μm to 200 μm, for example. The resistivity of the p type semiconductor substrate 10 is in the range of 100 Ωcm to 400 Ωcm, for example. The impurity concentration per unit area Nd of the n− type diffusion region 1 (hereinafter referred to simply as an impurity concentration of the n− type diffusion region 1), the n− type diffusion region 1 composing the nch MOSFET 105, the pch MOSFET 108, and the high voltage junction terminating structure 111, has a common value independent on these semiconductor devices and is determined to ensure a sufficient breakdown voltage and ensure sufficient current carrying capacity of the pch MOSFET 108. The impurity concentration per unit area Na (hereinafter referred to simply as an impurity concentration of the first p type diffusion region 2a and of the second p type diffusion region 2b) of the first p type diffusion region 2a composing the nch MOSFET 105 and the high voltage junction terminating structure 111 and of the second p type diffusion region 2b composing the pch MOSFET 108 also has a common value independent on these semiconductor devices and is determined to ensure a sufficient breakdown voltage and ensure sufficient current carrying capacity of the pch MOSFET 108. More specifically, the impurity concentration Nd of the n− type diffusion region 1 may be in the range of $1.3 \times 10^{12}/cm^2$ to $2.8 \times 10^{12}/cm^2$, for example. The impurity concentration Na of the first p type diffusion region 2a and the second p type diffusion region 2b (hereinafter, the first p type diffusion region 2a and the second p type diffusion region 2b are also called commonly as a p type diffusion region 2.) may be in the rage from $1.1 \times 10^{12}/cm^2$ to $1.4 \times 10^{12}/cm^2$, for example.

The upper limit value of the impurity concentration Nd of the n− type diffusion region 1 and the impurity concentration Na of the p type diffusion region 2 are determined based on the design condition of the double RESURF structure (a double RESUFR condition) when the n− type diffusion region 1 and the p type diffusion region 2 are completely depleted. As described previously, the double RESURF conditions are the following four conditions. A first condition is that the impurity concentration Nd of the n− type diffusion region 1 is larger than the impurity concentration per unit area Na of the p type diffusion region 2 (herein after referred to as an impurity concentration of the p type diffusion region 2) and a value about twice the impurity concentration Na of the p type diffusion region 2: Nd>Na and Nd≈2×Na. A second condition is that the impurity concentration Na of the p type diffusion region 2 is at most $1.4 \times 10^{12}/cm^2$: Na≤$1.4 \times 10^{12}/cm^2$. A third condition is that the impurity concentration Nd of the n− type diffusion region 1 is at most $2.8 \times 10^{12}/cm^2$: Nd≤$2.8 \times 10^{12}/cm^2$. A fourth condition is that the difference between the impurity concentration Nd of the n− type diffusion region 1 and the impurity concentration Na of the p type diffusion region 2 is at most $1.4 \times 10^{12}/cm^2$: Nd−Na≤$1.4 \times 10^{12}/cm^2$.

Figure 6:
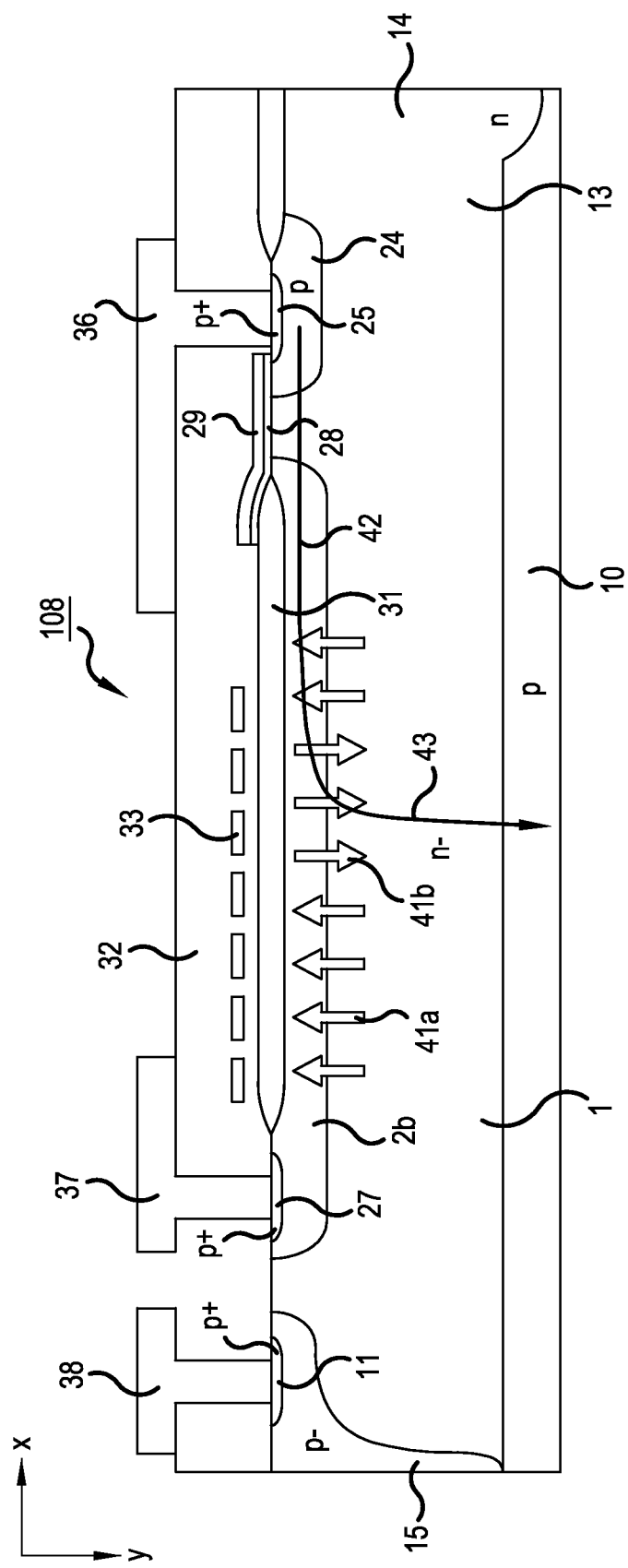
FIG. 6 is a sectional view showing generation of leakage current in a pch MOSFET in a conventional HVIC.
Figure 7:
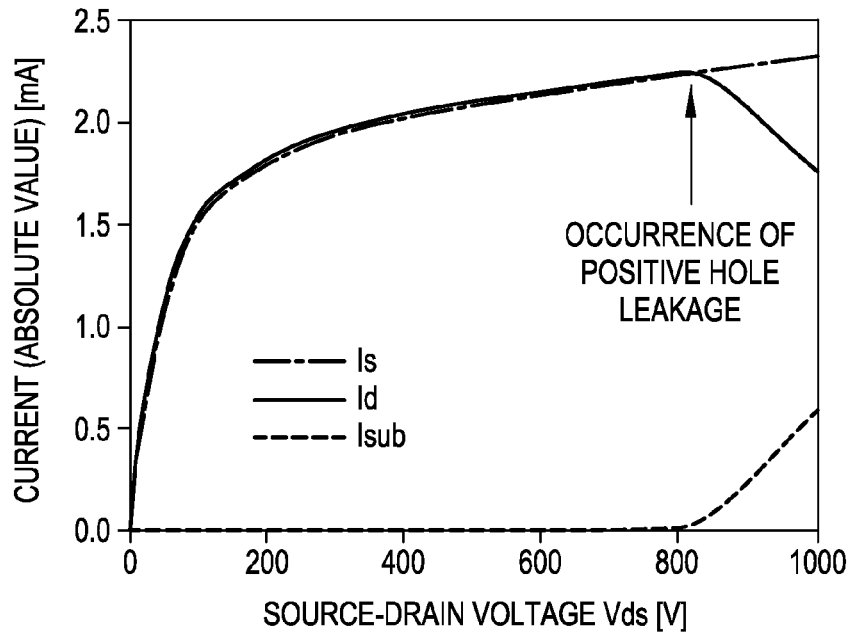
FIG. 7 shows a voltage-current characteristics of the HVIC depicted in FIG. 6.
Figure 8:
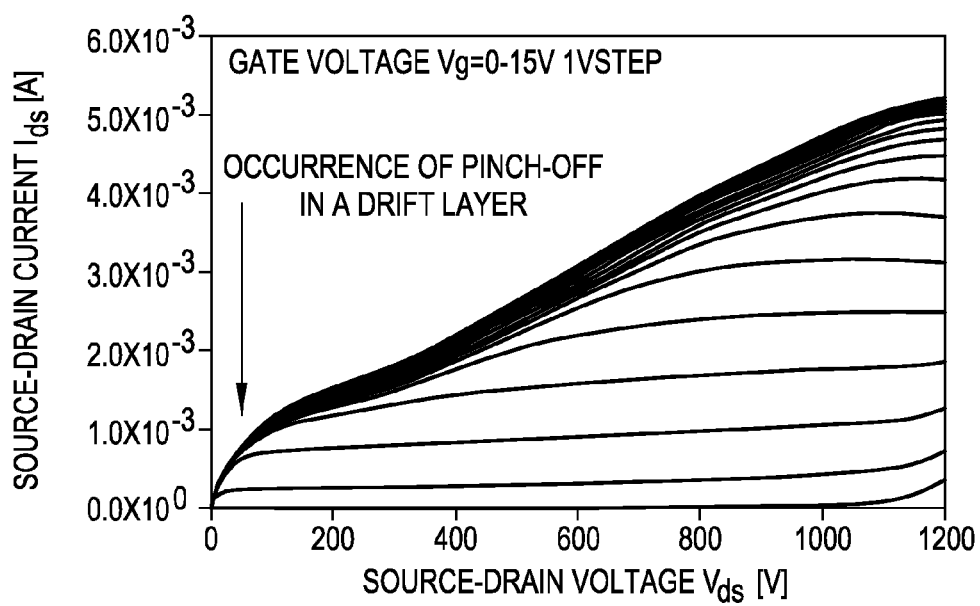
FIG. 8 shows abnormal output characteristics caused by the pinch-off of the drift region in the HVIC depicted in FIG. 6.

On the other hand, the lower limit value of the impurity concentration Nd of the n− type diffusion region 1 is determined based on the breakdown voltage in the depth direction, or vertical direction, (hereinafter referred to as a vertical breakdown voltage) required between the p type diffusion region 2 and the p type semiconductor substrate 10. The following describe in detail about a calculation method of the lower limit of the impurity concentration Nd of the n⁻ type diffusion region 1. FIG. 6 is a sectional view showing generation of leakage current in a pch MOSFET of a conventional HVIC. FIG. 7 shows a voltage-current characteristics of the HVIC depicted in FIG. 6. FIG. 8 shows abnormal output characteristics caused by the pinch-off of the drift region, which is the second p type diffusion region 2*b*, in the pch MOSFET 108 of the HVIC depicted in FIG. 6;

In the pch MOSFET 108 as shown in FIG. 6, when a voltage is applied between the source and the drain, an electric field 41*a* develops in the direction from the semiconductor substrate 10 toward the second p type diffusion region 2*b* at the pn junction between the n⁻ type diffusion region 1 and the second p type diffusion region 2*b*. The electric field 41*a* is indicated by the arrows in the negative y-axis direction, or upward direction. When the impurity concentration Nd of the n⁻ type diffusion region 1 is low, an electric field 41*b* in the direction from the second p type diffusion region 2*b* toward the p type semiconductor substrate 10 is generated at least in a portion of the pn junction between the n– type diffusion region 1 and the second p type diffusion region 2*b*. The electric field 41*b* is indicated by the arrows in the positive y-axis direction, or downward direction.

The electric field 41*b* in the direction from the second p type diffusion region 2*b* toward the p type semiconductor substrate 10 adversely affects the source-drain current 42 from the p⁺ source region 25 through the second p type diffusion region 2*b* to the p⁺ drain region 27 to leak to the n⁻ type diffusion region 1 and the p type semiconductor substrate 10. Thus, a leakage current 43 from the second p type diffusion region 2*b* toward the p type semiconductor substrate 10 is generated, or punch through occurs. As a consequence as shown in FIG. 7, upon turning ON of the pch MOSFET 108, the current Id flowing through the p⁺ type drain region 27, which is dominated by hole current, becomes smaller than the current Is flowing through the p⁺ type source region 25. Corresponding to just the decreased amount of the current Id through the p⁺ type drain region 27, the current $I_{sub}$ flowing to the p type semiconductor substrate 10 increases. Here, the current $I_{sub}$ is equal to the amount of decrease in the current Id.

When the impurity concentration Nd of the n⁻ type diffusion region 1 is low, as shown in FIG. 8, upon turning ON of the pch MOSFET 108, the second p type diffusion region 2*b* that functions as a drift region pinches off, and thus, even if the source-drain voltage $V_{ds}$ is raised, the source-drain current Ids does not increase. FIG. 8 shows relationship between the source-drain voltage $V_{ds}$ and the source-drain current Ids for the varied gate voltages Vg from zero volts to 15 volts with a step of one volt applied to the pch MOSFET 108.

It is shown that a sufficient ON breakdown voltage and current carrying capacity cannot be ensured when the impurity concentration Nd of the n⁻ type diffusion region 1 is low. The source-drain voltage Vds for a leakage current 43 to occur is the allowed maximum voltage $BV_{pt}$ in the depth direction, that is a vertical breakdown voltage, and given approximately by the formula (1) below. The formula (1) is obtained by deriving the source-drain voltage Vds using Poisson equation, when the electric field 41*b* in the direction from the second p type diffusion region 2*b* toward the p type semiconductor substrate 10 is generated at the pn junction between the n⁻ type diffusion region 1 and the second p type diffusion region 2*b*.

[Mathematical Formula 1]

$$BV_{pt} \approx \frac{qN_d^2}{8\varepsilon_0 \varepsilon_{si} |n_{sub}|} \frac{1}{g^2(X_{Emax})} \quad (1)$$

Wherein q is the elementary electric charge; $\varepsilon_0$ is a dielectric constant of vacuum; $\varepsilon_{Si}$ is a dielectric constant of silicon. $n_{sub}$ is an impurity concentration per unit volume of the p type semiconductor substrate 10 (hereinafter referred to simply as an impurity concentration of the p type semiconductor substrate 10). $X_{Emax}$ is the value of the x coordinate at which the electric field 41*b* in the y axis direction at the pn junction between the n⁻ type diffusion region 1 and the second p type diffusion region 2*b* becomes maximum, where the positive x axis direction is the direction from the p⁺ type drain region 27 to the p⁺ type source region 25, and the positive y axis direction is the depth direction from the front surface to the back surface of the p type semiconductor substrate 10. (See FIG. 6.) The $X_{Emax}$ is approximately represented by the formula (2) below. In the formula (2), the origin of the x coordinate (x=0) is the end of the p⁺ type drain region 27 in the p⁺ type source region 25 side, and the origin of the y coordinate (y=0) is the interface between the p type diffusion region 2 and the LOCOS film 31.

[Mathematical Formula 2]

$$X_{Emax} \approx L + t' \log\left(2\frac{t'}{L}\right) \quad (2)$$

$g(X_{Emax})$ is a function of $X_{Emax}$ and represented by the following Formula (3). In Formula (3), t' is represented by Formula (4) below. In Formula (3) and Formula (4), $t_{top}$ is a diffusion depth of the p type diffusion layer 2; $t_{tub}$ is a diffusion depth of the n⁻ diffusion layer 1; $t_{ox}$ is a thickness of the oxide film that is the sum of a thickness of the LOCOS film 31 and the thickness of a portion of the interlayer dielectric film 32 between the LOCOS film 31 and the resistive field plate 33; $\varepsilon_{ox}$ is a dielectric constant of the oxide film consisting of the LOCOS film 31 and the interlayer dielectric film 32; and L is a length of the LOCOS film 31. The function $g(X_{Emax})$ is approximately a function representing the coordinate of $X_{Emax}$ by a non-dimensional variable between 0 to 1, wherein a coordinate value is 0 at the position of the end of the p⁺ drain region 27 in the side of the p⁺ source region 25 and a coordinate value is 1 at the position of the end of the p⁺ type source region 25 in the side of the p⁺ drain region 27.

[Mathematical Formula 3]

$$g(X_{Emax}) = \frac{X_{Emax}}{L} - \left(1 - \frac{\varepsilon_{st}}{\varepsilon_{ox}} \frac{t_{top} t_{ox}}{t'^2}\right) \sinh\left(\frac{X_{Emax}}{t'}\right) / \sinh\left(\frac{L}{t'}\right) \quad (3)$$

[Mathematical Formula 4]

$$t' \approx \sqrt{\frac{\varepsilon_{si}}{\varepsilon_{ox}} t_{tub} t_{ox}} \quad (4)$$

From the Formula (1), the impurity concentration Nd of the n⁻ type diffusion region 1 necessary to ensure the vertical breakdown voltage BVpt between the second p⁻ type diffusion region 2b and the p type semiconductor substrate 10 is represented by the following Formula (5).

[Mathematical Formula 5]

$$N_d \geq g(X_{Emax})\sqrt{\frac{8\varepsilon_0\varepsilon_{si}}{q}|n_{sub}|BV_{pt}}} \quad (5)$$

For an HVIC of a breakdown voltage class of 1200 V, dimensions and impurity concentrations of some selected components takes generally the values in the following: the diffusion depth $t_{top}$ of the second p type diffusion region 2b is at most 2 µm; the diffusion depth $t_{tub}$ of the n⁻ type diffusion region 1 is at most 12 µm; the thickness of the oxide film $t_{ox}$ between the second p type diffusion region 2b and the resistive filed plate 33 is at most 0.6 µm; the length L of the LOCOS film 31 is at most 200 µm; and the resistivity of the p type semiconductor substrate 10 is in the range of 200 Ωcm to 400 Ωcm. Using the numerical values and Formula (5) above, the impurity concentration Nd of the n⁻ type diffusion region 1 is in the range of $1.3 \times 10^{12}/cm^2$ to $1.8 \times 10^{12}/cm^2$ in order to ensure ON breakdown voltage of at least 1,200 V. The impurity concentration Nd of the n⁻ type diffusion region 1 has the width of the above mentioned range because the impurity concentration Nd of the n⁻ type diffusion region 1 strongly depends on the impurity concentration per unit volume $n_{sub}$ of the p type semiconductor substrate 10.

For a HVIC of a 600 V breakdown voltage class, for example, dimensions and impurity concentrations of the components thereof generally take the following numerical values; the diffusion depth $t_{top}$ of the second p type diffusion region 2b is at most 2 µm; the diffusion depth $t_{tub}$ of the n⁻ diffusion region 1 is at most 10 µm; the thickness of the oxide film $t_{ox}$ between the second p type diffusion region 2b and the resistive field plate 33 is at most 0.6 µm; the length of the LOCOS film 31 is at most 100 µm; and the resistivity of the p type semiconductor substrate 10 is in the range of 100 Ωcm to 150 Ωcm. Using the above mentioned values and Formula (5), the impurity concentration Nd of the n⁻ type diffusion region 1 is in the range of $1.3 \times 10^{12}/cm^2$ to $1.6 \times 10^{12}/cm^2$ in order to ensure an ON breakdown voltage of at least 600 V.

The above result shows that an impurity concentration Nd of the n⁻ diffusion region 1 of at least $1.3 \times 10^{12}/cm^2$ ensures an ON breakdown voltage of the pch MOSFET 108 of at least 600 V. The upper limit of the impurity concentration Nd of the n⁻ diffusion region 1 is $2.8 \times 10^{12}/cm^2$ as shown previously from the double RESURF condition. Thus, the impurity concentration Nd of the n⁻ type diffusion region 1 may be in the range of $1.3 \times 10^{12}/cm^2$ to $2.8 \times 10^{12}/cm^2$.

Next, description is made in detail about calculation method of the lower limit of the impurity concentration Na of the first p type diffusion region 2a and the second p type diffusion region 2b. The lower limit of the impurity concentration Na of the first p type diffusion region 2a and the second p type diffusion region 2b is determined based on the current carrying capacity of the pch MOSFET 108 necessary for normal signal transmission. An HVIC is generally required not to malfunction against a dV/dt surge of smaller than at least 50 kV/µs. A dV/dt surge here is a rate of change of the source-drain voltage $V_{ds}$ due to application of the surge voltage. Accordingly, even though a dV/dt surge of not higher than 50 kV/µs is developed, the current carrying capacity $I_{min}$ of the pch MOSFET 108 needs to be determined so that the level shift-down circuit 107 composed using the pch MOSFET 108 performs normal signal transmission.

The parasitic capacitance Cp between the drain and the source of the pch MOSFET 108 is an order of 0.1 pF in average per 100 µm of channel width of the pch MOSFET 108 for the breakdown voltage class of 0 V to 1,200 V. Consequently, when a dV/dt surge of 50 kV/µs is generated, a displacement current of about 5 mA, which is equal to Cp×dV/dt, flows between the drain and the source of the pch MOSFET 108. In order for the level shift-down circuit 107 not to malfunction due to this displacement current, the current carrying capacity Imin of the pch MOSFET 108 should be at least 5 mA per 100 µm of channel width. The impurity concentration Na of the second p type diffusion region 2b composing the pch MOSFET 108 is determined in order to obtain the current carrying capacity Imin required by the pch MOSFET 108.

More specifically, the impurity concentration Na of the second p type diffusion region 2b is calculated as follows. The ON resistance of the pch MOSFET 108 depends on the drift resistance, which is determined by the impurity concentration Na of the second p type diffusion region 2b composing the drift region. The second p type diffusion region 2b works as a normal diffusion resistance when the source-drain voltage $V_{ds}$ is low. However, increase in the source-drain voltage Vds extends a depletion layer from the pn junction between the n⁻ type diffusion region 1 and the second p type diffusion region 2b, increasing the resistance of the second p type diffusion region 2b. When the second p type diffusion region 2b is completely depleted, the pch MOSFET 108 becomes a pinched-off state as in the case of a junction type field effect transistor, causing saturation of source-drain current $I_{ds}$. Thus, when the impurity concentration Na of the second p type diffusion region 2b is low, the second p type diffusion region 2b composing the drift region pinches-off before the channel pinches-off, and consequently sufficient source-drain current $I_{ds}$ cannot flow.

As a result as shown in FIG. 8, even though the source-drain voltage $V_{ds}$ is increased, the source-drain current $I_{ds}$ does not rise, which is an abnormal output characteristics of the pch MOSFET 108. In order to obtain the current carrying capacity $I_{min}$ required by the pch MOSFET 108, a source-drain current Ids has to be flowing that is at least equal to the current carrying capacity $I_{min}$ required by the pch MOSFET 108 when a pinch-off voltage $V_{pinch}$ is applied, the $V_{pinch}$ being a source-drain voltage Vds at which the second p type diffusion region 2b composing the drift region of the pch MOSFET 108 pinches-off. The pinch-off voltage $V_{pinch}$ of the drift region of the pch MOSFET 108 is the source-drain voltage $V_{ds}$ at which the second p type diffusion region 2b is completely depleted.

The Formula (6) below is satisfied by a depletion layer width $t_{dp}$ extending into the second p type diffusion region 2b from the pn junction between the n⁻ type diffusion region 1 and the second p type diffusion region 2b. Provided $t_p$ be a junction depth of the second p type diffusion region 2b, the depletion layer width $t_{dp}$ extending into the second p type diffusion region 2b from the pn junction between the n⁻ type diffusion region 1 and the second p type diffusion region 2b is equal to the $t_p$: $t_{dp}=t_p$. Thus, by solving Formula (6) with respect to the source-drain voltage $V_{ds}$, the pinch off voltage $V_{pinch}$, which is the source-drain voltage $V_{ds}$ at which the drift region, or the second p type diffusion region 2b, of the pch MOSFET 108 pinches-off, as given by Formula (7), wherein $n_a$ is an impurity concentration per unit volume of the second p type diffusion region 2b, and $n_d$ is an impurity concentration per unit volume of the n⁻ type diffusion region 1.

[Mathematical Formula 6]

$$t_{dp} = \sqrt{\frac{2\varepsilon_0\varepsilon_{si}}{q}\frac{n_a+n_d}{n_a n_d}V_{ds}}\frac{n_d}{n_a+n_d} = \sqrt{\frac{2\varepsilon_0\varepsilon_{si}}{q}\frac{V_{ds}}{n_a+n_d}\frac{n_d}{n_a}} \quad (6)$$

[Mathematical Formula 7]

$$V_{pinch} = \frac{q}{2\varepsilon_0\varepsilon_{si}}\frac{n_a}{n_d}(n_a+n_d)t_p^2 \approx \frac{q}{2\varepsilon_0\varepsilon_{si}}\frac{N_a^2}{n_d} \quad (7)$$

The impurity concentration $n_a$ per unit volume of the second p type diffusion region 2b is generally much higher than the impurity concentration $n_d$ per unit volume of the n⁻ type diffusion region 1: $n_a \gg n_d$. Thus, Formula (7) is derived assuming $(n_a+n_d) \approx n_a$. A resistance value $R_d$ of the drift region before pinch-off is approximately represented by the following Formula (8), wherein $\mu_h$ is a hole mobility.

[Mathematical Formula 8]

$$R_d = \frac{L}{qWN_a\mu_h} \quad (8)$$

Formula (7) and Formula (8) can be reduced to Formula (9) below for the maximum value $I_{max}$ of the source-drain current $I_{ds}$ at the pinch-off voltage $V_{pinch}$, wherein the current $I_{max}$ is the current value of the source-drain current $I_{ds}$ when a sufficiently large gate voltage is applied. In order for the maximum value $I_{max}$ of the source-drain current Ids in Formula (9) below to exceed the current carrying capacity $I_{min}$ required by the pch MOSFET 108, the impurity concentration $N_a$ of the second p type diffusion region 2b has to satisfy Formula (10) below.

[Mathematical Formula 9]

$$I_{max} = \frac{V_{pinch}}{R_d} \approx \frac{q^2\mu_h}{2\varepsilon_0\varepsilon_{si}}\frac{N_a^3}{n_d}\frac{W}{L} \quad (9)$$

[Mathematical Formula 10]

$$N_a \geq \sqrt[3]{I_{min}\frac{2\varepsilon_0\varepsilon_{si}}{q^2\mu_h}\frac{L}{W}n_d} \quad (10)$$

From the Formula (10), it can be seen that in order to ensure a current $I_{min}$=5 mA for the channel width of 100 μm required by the pch MOSFET 108 when a dV/dt surge of 50 kV/μs is subjected, the impurity concentration Na of the second p type diffusion region 2b should be $1.1\times10^{12}$/cm². In addition, the double RESURF condition results in the upper limit value of the impurity concentration Na of the second p type diffusion region 2b of $1.4\times10^{12}$/cm². Therefore, an optimum value of the impurity concentration Na of the second p type diffusion region 2b may be in the range of $1.1\times10^{12}$/cm² to $1.4\times10^{12}$/cm². A range of the impurity concentration Na of the first p type diffusion region 2a may be similar to the impurity concentration Na of the second p type diffusion region 2b.

In the calculation of the lower limit value of the impurity concentration Na of the second p type diffusion region 2b, the parameters in Formula (10) employ commonly used values in HVICs in a breakdown voltage class in the range of 600 V to 1,200 V. More specifically, the length L of the LOCOS film 31 is in the range of 100 μm to 200 μm; the hole mobility $\mu_h$ is 450 cm²/(V–s); and the impurity concentration $n_d$ per unit volume of the n⁻ type diffusion region 1 is $1.6\times10^{15}$/cm³. The impurity concentration $n_d$ per unit volume of the n⁻ type diffusion region 1 here is an average value in the depth direction of the impurity concentration per unit volume of the n⁻ type diffusion region 1 when the impurity concentration $N_d$ per unit area of the n⁻ type diffusion region 1 is $1.3\times10^{12}$/cm² and the diffusion depth $t_{tub}$ of the n⁻ diffusion region 1 is 12 μm.

Figure 9:
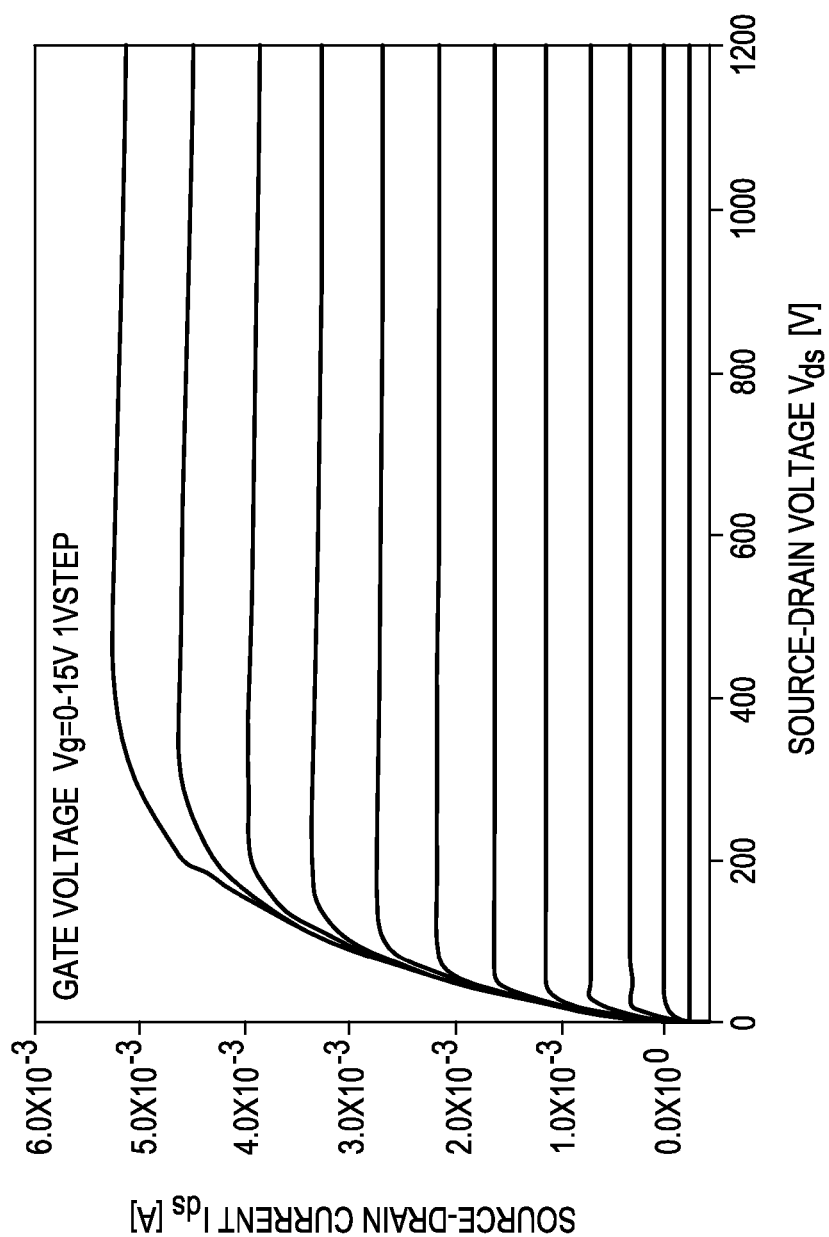
FIG. 9 shows output characteristics of an HVIC according to the First Embodiment.

Now, operation of the HVIC of Firsts Embodiment of the present invention will be described. FIG. 9 shows output characteristics of the HVIC of First Embodiment. As described previously, all the device elements composing the HVIC of First Embodiment of the nch MOSFET 105, the pch MOSFET 108, and the high voltage junction terminating structure 111 have a double RESURF structure. As a result, when the potential of the high side well region 112 (n type diffusion region 14) rises, depletion layer extends from the two pn junctions: one between the n⁻ type diffusion region 1 and the first diffusion region 2a or between the n⁻ type diffusion region 1 and the second diffusion region 2b, and the other between the n⁻ type diffusion region 1 and the p type semiconductor substrate 10, completely depleting the n⁻ type diffusion region 1 and the first p type diffusion region 2a or the second p type diffusion region 2b. Thus, a high breakdown voltage in the range of 600 V to 1,200 V is ensured.

The n⁻ type diffusion region 1 exposes to the front surface of the substrate at the place between the pch MOSFET 108 and the high voltage junction terminating structure 111, composing a single RESURF structure. This n⁻ type diffusion region 1 exposing to the front surface of the substrate is disposed between the second p type diffusion region 2b of the pch MOSFET 108 and the first p type diffusion region 2a of the high voltage junction terminating structure 111, and forms pn junctions with the first p type diffusion region 2a and the second p type diffusion region 2b. As a result, when the potential of the high side well region 112 rises, a depletion layer extends from these pn junctions to the part of the n⁻ type diffusion region 1 between the first p type diffusion region 2a and the second p type diffusion region 2b, which is the part of the n⁻ type diffusion region 1 exposing to the front surface of the substrate between the pch MOSFET 108 and the high voltage junction terminating structure 111. Because the first p type diffusion region 2a and the second p type diffusion region 2b are disposed with a predetermined gap w, the part of the n⁻ type diffusion region 1 between the first p type diffusion region 2a and the second p type diffusion region 2b also completely depleted, ensuring a high breakdown voltage.

A part of the n⁻ diffusion region 1 isolates the second diffusion region 2b electrically connected to the drain electrode 37 of the pch MOSFET 108 from the first p type diffusion region 2a electrically connected to the GND electrode 38 of the high voltage junction terminating structure 111. Consequently, even when the pch MOSFET 108 turns ON and the potential of the drain electrode 37 becomes higher than the ground (GND) potential, any leakage current is not generated. In addition, the impurity concentration Na of the second p type diffusion region 2b composing the drift region of the pch MOSFET 108 is set in the range of $1.1\times10^{12}$/cm² to $1.4\times10^{12}$/cm² as described earlier. Thus, as shown in FIG. 9, pinch-off does not occur in the second p type diffusion region 2b and a sufficient current carrying capacity of at least 5 mA per a channel width of 100 μm is obtained to perform normal signal transmission by the pch MOSFET.

As described above, First Embodiment has all the component device elements of nch MOSFET, pch MOSFET, and high voltage junction terminating structure provided on a single substrate having each double RESURF structure, and the impurity concentrations of the n⁻ type diffusion region and the p type diffusion region composing the double RESURF structure are optimized to ensure and achieve the optimum conditions for both the breakdown voltage of the HVIC and the current carrying capacity of the pch MOSFET. More specifically, the impurity concentration of the n⁻ diffusion region composing the double RESURF structure is made at a value in the range of $1.3 \times 10^{12}/cm^2$ to $2.8 \times 10^{12}/cm^2$ to preventing the pch MOSFET from punching-through. Thus, the breakdown voltage of the HVIC is maintained. The impurity concentration of the p type diffusion region composing the double RESURF structure in the range of $1.1 \times 10^{12}/cm^2$ to $1.4 \times 10^{12}/cm^2$ ensures the optimum current carrying capacity of the pch MOSFET, while the breakdown voltage of the HVIC is maintained.

Second Embodiment

Now, a construction of an HVIC of Second Embodiment of the present invention will be described. FIG. 10 is a plan view showing a planar construction of the HVIC of Second Embodiment. The sectional construction along the cut line B-B' indicated in FIG. 10 is same as that in FIG. 3. The sectional construction along the cut line C-C' indicated in FIG. 10 is the same as that in FIG. 3 in which the p type diffusion region 24, the p⁺ type source region 25, the p⁺ type drain region 27, and the second p type diffusion region 2b in FIG. 3 are replaced by a p type diffusion region 24a, a p⁺ type source region 25a, which is a ninth semiconductor region, a p⁺ type drain region 27a, which is a tenth semiconductor region, and a first p type diffusion region 2a, which is fifth semiconductor region, respectively. The sectional construction along the cut line D-D' indicated in FIG. 10 is same as that of FIG. 5.

The HVIC according to Second Embodiment is different from the HVIC according to First Embodiment in that a pch MOSFET 108a, which is a second field effect transistor of the first conductivity type, is provided having a double RESURF structure comprising the first p type diffusion region 2a, the n⁻ type diffusion region 1, and the p type semiconductor substrate 10 instead of the high voltage junction terminating structure and the nch MOSFET in the level shift-up circuit. The pch MOSFET 108 and the pch MOSFET 108a, having the same construction, are provided on nearly whole surface of the high voltage region (n⁻ type diffusion region 1). The pch MOSFET 108a occupies larger area on the chip than the pch MOSFET 108 and disposed, for example, in a ring shape like the letter C surrounding the high side well region 112. The first p type diffusion region 2a of the pch MOSFET 108a is isolated from the second p type diffusion region 2b of the pch MOSFET 108 by the n⁻ type diffusion region 1. The gap w between the first p type diffusion region 2a and the second p type diffusion region 2b is the same as that in First Embodiment.

In the Second Embodiment, too, a single RESURF structure only exists, as in the case of First Embodiment, at the portion of the n⁻ type diffusion region 1 between the first p type diffusion region 2a and the second p type diffusion region 2b. As a result, as in the First Embodiment, the portion of the n⁻ type diffusion region 1 exposing to the front surface of the substrate between the first p type diffusion region 2a and the second p type diffusion region 2b is completely depleted by the depletion layer extending from the pn junction between the n⁻ type diffusion region 1 and the first p type diffusion region 2a and the pn junction between the n⁻ type diffusion region 1 and the second p type diffusion region 2b. Thus, sufficient breakdown voltage is ensured even through the impurity concentration Nd of the n⁻ type diffusion region 1 is optimized for the double RESURF structure. Thus, optimization of the impurity concentration Nd of the n⁻ type diffusion region 1 and the impurity concentration Na of the p type diffusion region 2 as in First Embodiment ensures optimized condition of the breakdown voltage of the HVIC and the current carrying capacity of the pch MOSFET 108 and the pch MOSFET 108a.

The HVIC according to Second Embodiment can be applied to HVICs in industrial equipment having only a level shift-down circuit 107. In that case, the pch MOSFET 108 and the pch MOSFET 108a having the same construction compose different level shift-down circuits 107 which can be used for a set signal and a reset signal.

The Second Embodiment is not provided with an nch MOSFET in a high voltage region, and thus avoids the trade-off relationship between obtaining an optimum breakdown voltage of the HVIC and obtaining an optimum current carrying capacity of the pch MOSFET, and thus provides the same effects as in First Embodiment. In the case a plurality of device elements having the same construction are arranged in the high voltage region in Second Embodiment, the device elements can be disposed in each of the p type diffusion regions isolated by the n⁻ type diffusion region 1 to compose double RESURF structures, obtaining the same effects as in the case a plurality of device elements with different construction are arranged in the high voltage region.

Third Embodiment

Figure 11:
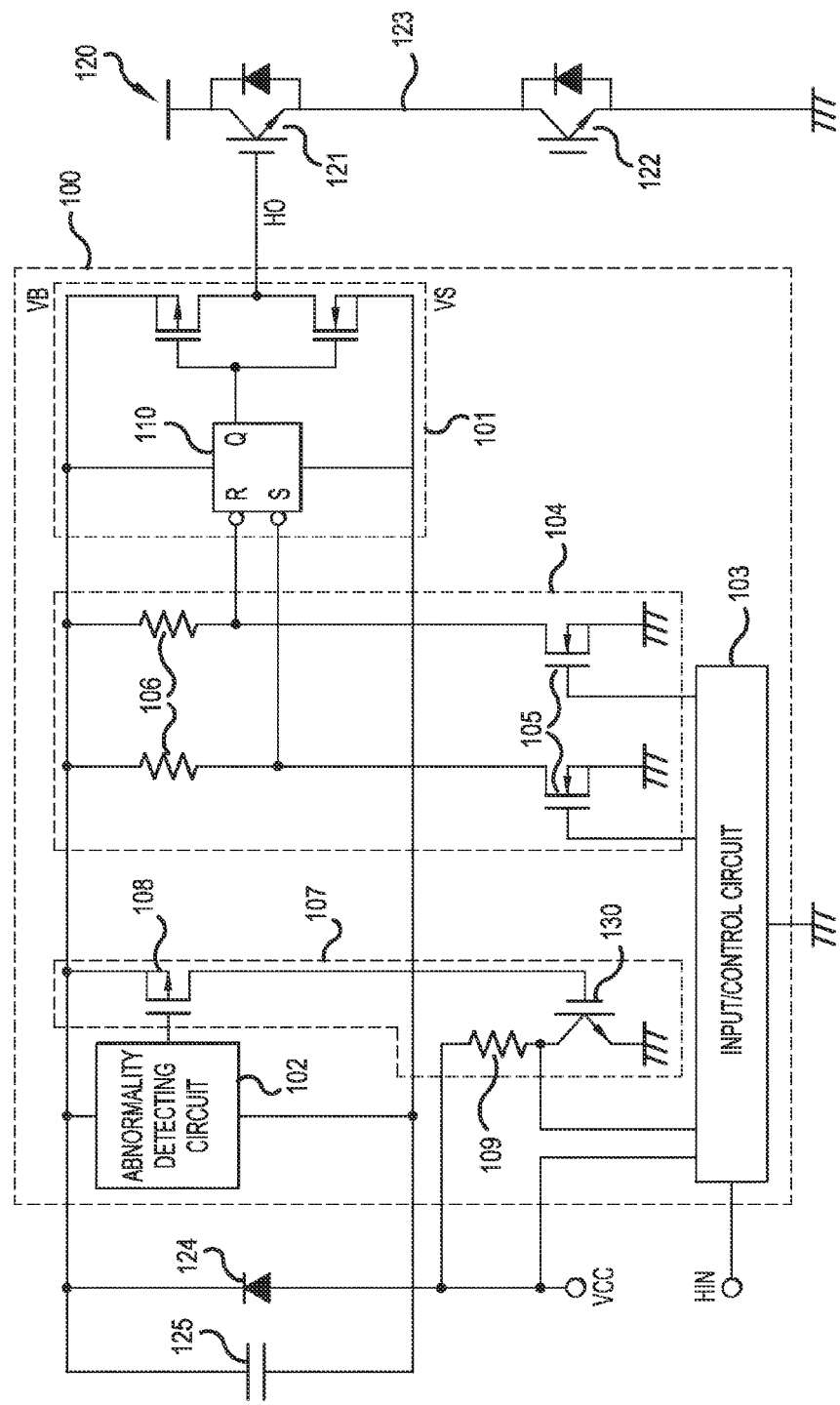
FIG. 11 is a circuit diagram showing a circuit construction of an HVIC according to the third embodiment.
Figure 13:
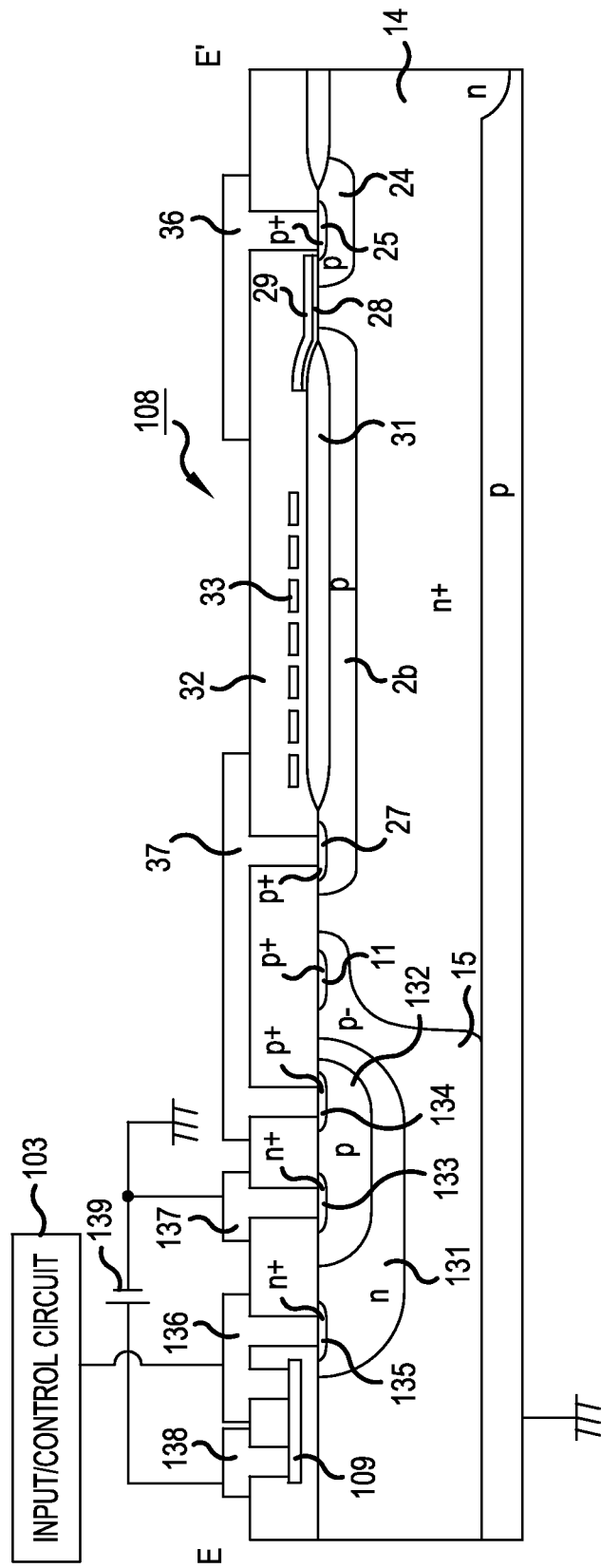
FIG. 13 is a sectional view showing the sectional construction along the line E-E' indicated in FIG. 12.

Next, a construction of an HVIC according to Third Embodiment will be described. FIG. 11 is a circuit diagram showing a circuit construction of an HVIC according to the Third Embodiment; FIG. 12 is a plan view showing a planar structure of an HVIC according to the Third Embodiment; FIG. 13 is a sectional view showing the sectional construction along the line E-E' indicated in FIG. 12. The sectional construction of the pch MOSFET 108 of the sectional construction shown in FIG. 13 along the cut line E-E' indicated in FIG. 12 is same as FIG. 3 for First Embodiment. The sectional constructions along the cut line A-A', along the cut line C-C', and along the cut line D-D' are same as those in FIG. 2, FIG. 4 and FIG. 5, respectively.

The HVIC according to Third Embodiment is different from the HVIC according to First Embodiment in that the HVIC according to Third Embodiment is provided with a level shift-down circuit 107 that is composed of a pch MOSFET 108, a level shift resistor 109, and an npn bipolar transistor 130. More specifically, as shown in FIG. 11, the base of the npn bipolar transistor 130 is connected to the drain of the pch MOSFET 108. The collector of the npn bipolar transistor 130 is connected to an input/control circuit 103, and the emitter is grounded. An end of the level shift resistor 109 is connected to a node between the anode of a bootstrap diode and a VCC terminal, which is a power supply terminal supplying a power supply potential VCC, and the other end is connected to the collector of the npn bipolar transistor 130. Thus, the level shift resistor 109 is connected between the collector of the npn bipolar transistor 130 and the VCC terminal.

As shown in FIG. 12, the npn bipolar transistor 130 is disposed in the low side region that is electrically isolated from the high side well region 112 and a high voltage region, which is the n⁻ diffusion region 1, by the p⁺ type GND region 11, for example. The npn bipolar transistor 130 includes an n type diffusion region 131, which is a collector or a sixth semiconductor region, a p type diffusion region 132, which is a base or seventh semiconductor region, and an n⁺ type diffusion region 133, which is an emitter or an eighth semiconductor region. The npn bipolar transistor 130 is disposed within the p⁻ type diffusion region 15 and opposing to the second diffusion region 2b composing the pch MOSFET 108 of the level shift-down circuit 107 with the interposed p⁺ type GND region 11. In Third Embodiment, the gap w between the first p type diffusion region 2a and the second p type diffusion region 2b may be at most 5 μm. The isolation voltage between the pch MOSFET 108 and the high voltage junction terminating structure 111 is 1 V, for example.

The sectional construction of the npn bipolar transistor 130 is as follows. As shown in FIG. 13, in the surface layer of the front surface side of the substrate and outer peripheral side than the p⁺ type GND region 11 of the p⁻ type diffusion region 15, an n type diffusion region 131 serving as a collector region is selectively formed. In the n type diffusion region 131, a p type diffusion region 132 serving as a base region is selectively formed. In the p type diffusion region 132, an n⁺ diffusion region 133 serving as an emitter region is formed. On the front surface of the substrate and outer peripheral side than the npn bipolar transistor 130, a level shift resistor 109 is formed intercalating an insulation film therebetween. In the p type diffusion region 132, separated from the n⁺ type diffusion region 133, a p⁺ type diffusion region 134 is selectively formed. The drain electrode 37 of the pch MOSFET 108 is in contact with the p⁺ type diffusion region 134 through a contact hole penetrating the interlayer dielectric film 32 in the depth direction and is electrically connected to the p type diffusion region 132.

In the n type diffusion region 131, separated from the p type diffusion region 132, an n⁺ diffusion region 135 is selectively formed. A collector electrode 136, which is a third electrode, is in contact with the n⁺ diffusion region 135 through a contact hole penetrating the interlayer dielectric film 32 in the depth direction, and electrically connected to the n type diffusion region 131. The collector electrode 136 is in contact with the level shift resistor 109 through a contact hole penetrating the interlayer dielectric film 32 in the depth direction. The collector electrode 136 is connected to the input/control circuit 103. A VCC electrode 138 is in contact with the level shift resistor 109. The VCC electrode 138, which is a power supply potential electrode, is connected to a positive terminal of a power supply 139 for supplying a power supply potential VCC of circuits arranged in the low side region. An emitter electrode 137, which is a fourth electrode, is in contact with the n⁺ type diffusion region 133. The emitter electrode 137 is also connected to the negative terminal, which is a ground potential, of the power supply 139.

Now, operation of the HVIC according to Third Embodiment will be described in the following. The source-drain current $I_{ds}$ of the pch MOSFET 108 becomes a base current $I_b$ of the npn bipolar transistor 130: $I_b = I_{ds}$. A collector current $I_c$ of the npn bipolar transistor 130 flows through the level shift resistor 109. Consequently, a potential difference is generated across the level shift resistor 109 with a magnitude of the product of the resistance value R of the level shift resistor 109 and the collector current Ic:=Ic×R=$I_{ds}$×hFE×R. Here, hFE is an amplification factor of the npn bipolar transistor 130. In order for the potential difference: =Ids×hFE×R, across the level shift resistor 109 to exceed the power supply potential VCC, the source-drain current Ids through the pch MOSFET 108, the amplification factor hFE of the npn bipolar transistor 130, and the resistance value R of the level shift resistor 109 are determined. Accordingly, the potential of the n type diffusion region 131, which is a collector, can be changed between the power supply potential VCC and the GND potential. Possible values, though not necessary values, are, for example, a source-drain current Ids through the pch MOSFET 108 of 1 mA, an amplification factor hFE of the npn bipolar transistor 130 of 50, and a resistance value R of the level shift resistor 109 of 1 kΩ. The operation of the npn bipolar transistor 130 like this allows the signal with the reference potential of the source potential of the pch MOSFET 108 to be level shifted-down to a signal with the reference potential of the ground potential.

Because the gap w between the first p type diffusion region 2a and the second p type diffusion region 2b is a small value of at most 5 μm in this Third Embodiment, electric field concentration hardly occurs in the n⁻ type diffusion region 1. As a result, the breakdown voltage of the HVIC is held at a high value. Therefore, the optimum conditions can be achieved in both the breakdown voltage of the HVIC and the current carrying capacity of the pch MOSFET 108. Because of the small value of at most 5 μm of the gap w, which is the portion of the n⁻ type diffusion region 1 between the first p type diffusion region 2a and the second p type diffusion region 2b, the breakdown voltage of that portion isolating the pch MOSFET 108 from the high voltage junction terminating structure 111 is decreased down to 1 V, for example, which means difficulty in holding the breakdown voltage to be at least 5V. However, normal signal transmission can be performed by the pch MOSFET 108 in the Third Embodiment even though the breakdown voltage of the part isolating the pch MOSFET 108 and the high voltage junction terminating structure 111 is lower than 5 V, for the following reason.

A breakdown voltage as low as 1 V of the part isolating the pch MOSFET 108 and the high voltage junction terminating structure 111 means that the maximum value of the drain potential $V_d$ of the pch MOSFET 108 is 1 V. In the conventional technology, the drain of the pch MOSFET 108 is connected to the gate of a MOSFET that composes an inverter circuit. Consequently, when the gate threshold voltage is not lower than 1 V, the pch MOSFET 108 with the maximum value of the drain potential $V_d$ of 1 V cannot perform signal transmission. On the contrary in Third Embodiment, the drain of the pch MOSFET 108 is connected, in place of the MOSFET, to the base of the npn bipolar transistor 130. The npn bipolar transistor 130 can operate with a base-emitter voltage that is not smaller than the built-in voltage, which is about 0.6 V for silicon, caused by the pn junction between the p type diffusion region 132 and the n⁺ type diffusion region 133. Therefore, signal transmission by the pch MOSFET 108 can be performed even though the drain potential $V_d$ of the pch MOSFET 108 is 1 V at the maximum.

Instead of the npn bipolar transistor 130, a MOSFET having a gate threshold voltage of about 0.6 V can be employed. In that case, the gate of this MOSFET is connected to the drain of the pch MOSFET 108. The drain of the MOSFET is connected to the input/control circuit 103, and the source is grounded. One terminal of the level shift resistor 109 is connected to the anode of the bootstrap diode and the other terminal is connected to the drain of the MOSFET.

As described above, Third Embodiment also provides the same effects as First Embodiment.

Fourth Embodiment

Figure 14:
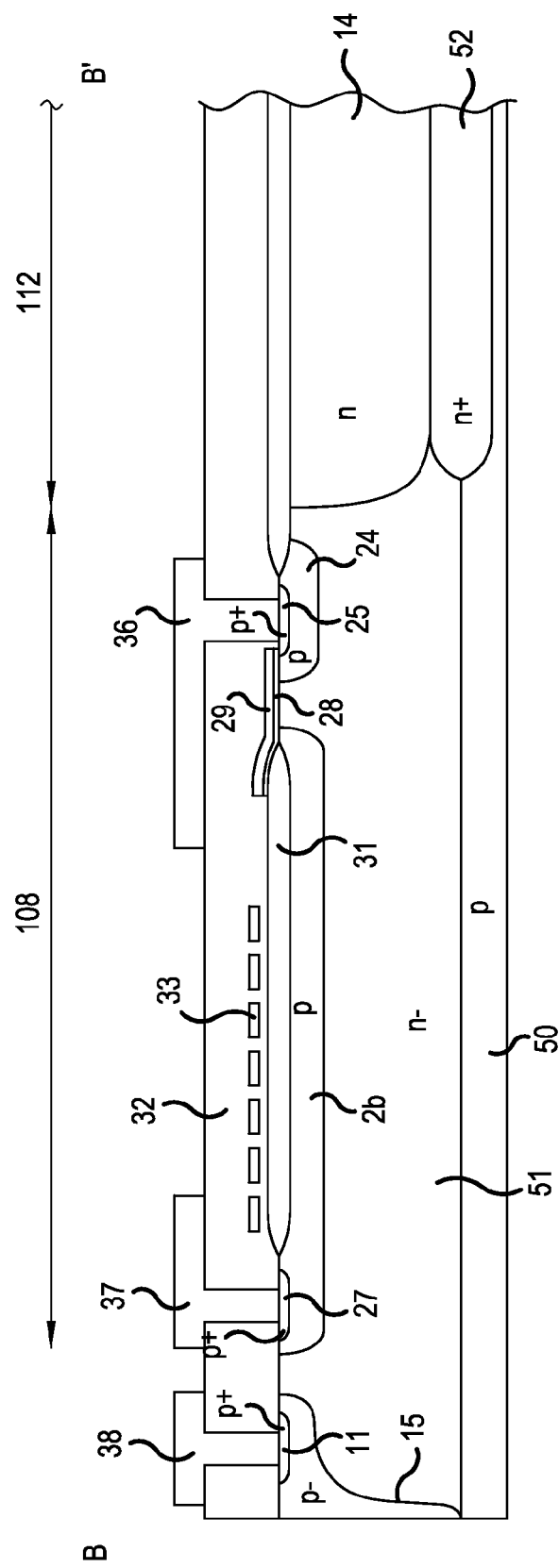
FIG. 14 is a sectional view showing the construction of an HVIC according to the fourth embodiment.

Next, a construction of an HVIC according to Fourth Embodiment is described. FIG. 14 is a sectional view showing a construction of an HVIC according to Fourth Embodiment. FIG. 14 illustrates a sectional construction along the cut line B-B' indicated in FIG. 1, which is a sectional construction of the pch MOSFET 108 of the level shift-down circuit 107. The HVIC according Fourth Embodiment differs from the HVIC according to First Embodiment in that an n⁻ type epitaxial layer 51 is provided on a p type semiconductor substrate 50 and a double RESURF structure is provided that is composed of the second p type diffusion region 2b, the n⁻ type epitaxial layer 51, and the p type semiconductor substrate 50.

More specifically as shown in FIG. 14, an n⁻ type epitaxial layer 51 is formed on the front surface of the p type semiconductor substrate 50. On the front surface layer of the n⁻ epitaxial layer 51 on the p type semiconductor substrate 50, the second p type diffusion region 2b is selectively formed surrounding the n type diffusion region 14 of the high side well region 112. The n⁻ type diffusion region shown by the symbol 13 that composes the high side well region 112 in First Embodiment is composed of the n⁻ type epitaxial layer 51 in Fourth Embodiment.

In the high side well region 112, an n⁺ type embedded layer 52 is provided at the interface between the p type semiconductor substrate 50 and the n⁻ type epitaxial layer 51. The n type diffusion region 14 is formed from the surface of the n⁻ type epitaxial layer 51 on the p type semiconductor substrate 50 penetrating in the depth direction across the n⁻ type epitaxial layer 51 reaching the n⁺ type embedded layer 52. The p⁻ type diffusion region 15 electrically connected to the GND electrode 38 is formed from the front surface of the n⁻type epitaxial layer 51 on the p type semiconductor substrate 50 penetrating in the depth direction across the n⁻ type epitaxial layer 51 reaching the p type semiconductor substrate 50.

The n⁺ type embedded layer 52 can be omitted. In that case, the n type diffusion region 14 may be formed to reach the p type semiconductor substrate 50. Although not depicted, the high voltage junction terminating structure 111 and the nch MOSFET 105 of the level shift-up circuit 104 have a double RESURF structure comprising a first p type diffusion region 2a, the n⁻ type epitaxial layer 51, and the p type semiconductor substrate 50 as in the case of the pch MOSFET 108.

As described above, Fourth Embodiment which constructs a double RESURF structure using an epitaxial layer, also provides the same effect as First Embodiment.

In the embodiments of the present invention described thus far, variation and modification are possible. For example, dimensions and surface concentrations of component parts can be determined according to required specifications. In the description of the embodiments, the first conductivity type is a p type, and the second conductivity type is an n type. However, the present invention holds when the first conductivity type is an n type and the second conductivity is a p type.

The semiconductor devices of the present invention can be effectively applied to power conversion devices such as inverters, power supply devices for industrial equipment, and high voltage integrated circuit devices for such as igniters of vehicles.

What is claimed is:

1. A semiconductor device comprising:
   a first field effect transistor of a first conductivity type and including:
   a first semiconductor region of a second conductivity type disposed on a semiconductor substrate of a first conductivity type or formed on a surface layer of the semiconductor substrate of the first conductivity type,
   a second semiconductor region of a first conductivity type selectively formed on a surface layer of the first semiconductor region;
   a third semiconductor region of the first conductivity type selectively formed on the surface layer of the first semiconductor region and spaced apart from the second semiconductor region;
   a first gate electrode formed on a surface of a portion of the first semiconductor region disposed between the second semiconductor region and the third semiconductor region with an intercalated first gate insulating film;
   a fourth semiconductor region of the first conductivity type selectively formed in the second semiconductor region;
   a first electrode connected to the third semiconductor region; and
   a second electrode connected to the fourth semiconductor region; and
   a device element including a fifth semiconductor region of the first conductivity type formed on the surface layer of the first semiconductor region, spaced apart from the second semiconductor region and the third semiconductor region, the device element being isolated from the first field effect transistor by a part of the first semiconductor region disposed between the second semiconductor region and the fifth semiconductor region,
   wherein an impurity concentration of the first semiconductor region disposed between the second semiconductor region and the semiconductor substrate is in the range of $1.3 \times 10^{12}/cm^2$ to $2.8 \times 10^{12}/cm^2$, and an impurity concentration of the second semiconductor region is in the range of $1.1 \times 10^{12}/cm^2$ to $1.4 \times 10^{12}/cm^2$.

2. The semiconductor device according to claim 1, wherein the resistivity of the semiconductor substrate is in the range of 100 Ωcm to 400 Ωcm.

3. The semiconductor device according to claim 1, further comprising:
   a bipolar transistor including:
   a sixth semiconductor region of the second conductivity type selectively formed in a surface layer of the first semiconductor region and spaced apart from the second semiconductor region,
   a seventh semiconductor region of the first conductivity type selectively formed in the sixth semiconductor region and electrically connected to the second electrode,
   an eighth semiconductor region of the second conductivity type selectivity formed in the seventh semiconductor region and configured to be at a potential of the semiconductor substrate,
   a third electrode electrically connected to the sixth semiconductor region, and
   a fourth electrode electrically connected to the eighth semiconductor region;
   a power supply potential electrode configured to be at a higher potential than the semiconductor substrate; and
   a resistor electrically connected to a node between the third electrode and the power supply potential electrode.

4. The semiconductor device according to claim 3, wherein a distance between the second semiconductor region and the fifth semiconductor region is in the range of 3 μm to 5 μm.

5. The semiconductor device according to claim 1, wherein the device element is a field effect transistor of the second conductivity type including:

a ninth semiconductor region of the first conductivity type selectively formed in the front surface layer of the first semiconductor region and spaced apart from the fifth semiconductor region;
a tenth semiconductor region of the second conductivity type selectively formed in the ninth semiconductor region;
a second gate electrode formed on the surface of a part of the ninth semiconductor region disposed between the first semiconductor region and the tenth semiconductor region with an intercalated second gate insulating film;
an eleventh semiconductor region of the second conductivity type selectively formed in a front surface layer of the first semiconductor region, spaced apart from the fifth semiconductor region, and disposed in an opposite side of the ninth semiconductor region interposing the fifth semiconductor region;
a fifth electrode electrically connected to the tenth semiconductor region; and
a sixth electrode electrically connected to the eleventh semiconductor region.

6. The semiconductor device according to claim 1, wherein the device element is a second field effect transistor of the first conductivity type including:
a ninth semiconductor region of the first conductivity type selectively formed in the front surface layer of the first semiconductor region and spaced apart from the fifth semiconductor region;
a second gate electrode formed on a part of the first semiconductor region disposed between the fifth semiconductor region and the ninth semiconductor region with an intercalated second gate insulating film;
a tenth semiconductor region of the first conductivity type selectively formed in the fifth semiconductor region;
a fifth electrode electrically connected to the ninth semiconductor region; and
a sixth electrode electrically connected to the tenth semiconductor region.

7. The semiconductor device according to claim 1, wherein a distance between the second semiconductor region and the fifth semiconductor region is in the range of 3 μm to 10 μm.

8. The semiconductor device according to claim 1, wherein the second semiconductor region and the fifth semiconductor region have substantially the same impurity concentration.

9. A semiconductor device comprising:
a first field effect transistor of a first conductivity type and including:
a first semiconductor region of a second conductivity type disposed on a semiconductor substrate of a first conductivity type or formed on a surface layer of the semiconductor substrate of the first conductivity type,
a second semiconductor region of a first conductivity type selectively formed on a surface layer of the first semiconductor region;
a third semiconductor region of the first conductivity type selectively formed on the surface layer of the first semiconductor region and spaced apart from the second semiconductor region;
a first gate electrode formed on a surface of a portion of the first semiconductor region disposed between the second semiconductor region and the third semiconductor region with an intercalated first gate insulating film;
a fourth semiconductor region of the first conductivity type selectively formed in the second semiconductor region;
a first electrode connected to the third semiconductor region; and
a second electrode connected to the fourth semiconductor region; and
a device element including a fifth semiconductor region of the first conductivity type formed on the surface layer of the first semiconductor region, spaced apart from the second semiconductor region and the third semiconductor region, the device element being isolated from the first field effect transistor by a part of the first semiconductor region disposed between the second semiconductor region and the fifth semiconductor region;
wherein the first semiconductor region has an impurity concentration such that when a voltage not higher than a desired breakdown voltage is applied between the third semiconductor region and the fourth semiconductor region, no electric field directing from the second semiconductor region toward the semiconductor substrate is generated at a pn junction between the first semiconductor region and the second semiconductor region.

10. The semiconductor device according to claim 9, wherein an impurity concentration of a portion of the first semiconductor region disposed between the second semiconductor region and the semiconductor substrate is in the range of $1.3 \times 10^{12}/cm^2$ to $2.8 \times 10^{12}/cm^2$.

11. The semiconductor device according to claim 9, wherein an impurity concentration of the second semiconductor region is in the range of $1.1 \times 10^{12}/cm^2$ to $1.4 \times 10^{12}/cm^2$.

12. The semiconductor device according to claim 9, further comprising:
a bipolar transistor including:
a sixth semiconductor region of the second conductivity type selectively formed in a surface layer of the first semiconductor region and spaced apart from the second semiconductor region,
a seventh semiconductor region of the first conductivity type selectively formed in the sixth semiconductor region and electrically connected to the second electrode,
an eighth semiconductor region of the second conductivity type selectivity formed in the seventh semiconductor region and configured to be at a potential of the semiconductor substrate,
a third electrode electrically connected to the sixth semiconductor region, and
a fourth electrode electrically connected to the eighth semiconductor region;
a power supply potential electrode configured to be at a higher potential than the semiconductor substrate; and
a resistor electrically connected to a node between the third electrode and the power supply potential electrode.

13. The semiconductor device according to claim 12, wherein a distance between the second semiconductor region and the fifth semiconductor region is in the range of 3 μm to 5 μm.

14. The semiconductor device according to claim 9, wherein the device element is a field effect transistor of the second conductivity type including:
a ninth semiconductor region of the first conductivity type selectively formed in the front surface layer of the first semiconductor region and spaced apart from the fifth semiconductor region;
a tenth semiconductor region of the second conductivity type selectively formed in the ninth semiconductor region;

a second gate electrode formed on the surface of a part of the ninth semiconductor region disposed between the first semiconductor region and the tenth semiconductor region with an intercalated second gate insulating film;

an eleventh semiconductor region of the second conductivity type selectively formed in a front surface layer of the first semiconductor region, spaced apart from the fifth semiconductor region, and disposed in an opposite side of the ninth semiconductor region interposing the fifth semiconductor region;

a fifth electrode electrically connected to the tenth semiconductor region; and a sixth electrode electrically connected to the eleventh semiconductor region.

15. The semiconductor device according to claim 9, wherein the device element is a second field effect transistor of the first conductivity type including:

a ninth semiconductor region of the first conductivity type selectively formed in the front surface layer of the first semiconductor region and spaced apart from the fifth semiconductor region;

a second gate electrode formed on a part of the first semiconductor region disposed between the fifth semiconductor region and the ninth semiconductor region with an intercalated second gate insulating film;

a tenth semiconductor region of the first conductivity type selectively formed in the fifth semiconductor region;

a fifth electrode electrically connected to the ninth semiconductor region; and a sixth electrode electrically connected to the tenth semiconductor region.

16. The semiconductor device according to claim 9, wherein a distance between the second semiconductor region and the fifth semiconductor region is in the range of 3 µm to 10 µm.

17. The semiconductor device according to claim 9, wherein the second semiconductor region and the fifth semiconductor region have substantially the same impurity concentration.

* * * * *